(12) United States Patent
Cha et al.

(10) Patent No.: US 11,862,263 B2
(45) Date of Patent: Jan. 2, 2024

(54) STORAGE DEVICE AND METHOD OF OPERATING THE SAME

(71) Applicant: SAMSUNG ELECTRONICS CO., LTD., Suwon-si (KR)

(72) Inventors: Sangsoo Cha, Suwon-si (KR); Suyong Jang, Hanam-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 17/729,048

(22) Filed: Apr. 26, 2022

(65) Prior Publication Data

US 2022/0254422 A1 Aug. 11, 2022

Related U.S. Application Data

(63) Continuation of application No. 17/038,416, filed on Sep. 30, 2020, now Pat. No. 11,335,423.

(30) Foreign Application Priority Data

Dec. 2, 2019 (KR) .......................... 10-2019-0158459

(51) Int. Cl.
| | | |
|---|---|---|
| G11C 16/16 | (2006.01) | |
| G11C 16/34 | (2006.01) | |
| G11C 29/00 | (2006.01) | |
| G11C 16/26 | (2006.01) | |

(52) U.S. Cl.
CPC .......... *G11C 16/3495* (2013.01); *G11C 16/16* (2013.01); *G11C 16/26* (2013.01); *G11C 29/72* (2013.01)

(58) Field of Classification Search
CPC ..... G11C 16/3495; G11C 16/16; G11C 16/26; G11C 29/72; G11C 16/0483; G11C 29/76; G11C 29/021; G11C 29/028; G06F 12/0246; G06F 12/1009; G06F 3/064;
(Continued)

(56) References Cited

U.S. PATENT DOCUMENTS

| | | |
|---|---|---|
| 9,218,890 B2 | 12/2015 | Avila et al. |
| 10,120,589 B2 | 11/2018 | Jung |
| 10,373,693 B2 | 8/2019 | Cha et al. |

(Continued)

OTHER PUBLICATIONS

Office Action dated Oct. 12, 2021 in corresponding U.S. Appl. No. 17/038,416.

*Primary Examiner* — Xiaochun L Chen
(74) *Attorney, Agent, or Firm* — F. Chau & Associates, LLC

(57) ABSTRACT

A method of operating a storage device including a non-volatile memory includes storing program and erase counts of the non-volatile memory as metadata in units of super blocks, wherein each of the super blocks includes a pre-defined number of blocks of the non-volatile memory, performing a read operation on a first block included in a first super block based on a first read level, storing the first read level as a history read level of the first super block in a history buffer when the read operation on the first block is successful, receiving a read request for a second block of the first super block and an address of the second block from a host, and performing a read operation on the second block based on the history read level stored in the history buffer. The pre-defined number is at least two.

19 Claims, 26 Drawing Sheets

(58) Field of Classification Search
CPC ...... G06F 3/0604; G06F 3/061; G06F 3/0626; G06F 3/0656; G06F 3/0679
See application file for complete search history.

(56) References Cited

U.S. PATENT DOCUMENTS

| | | |
|---|---|---|
| 10,943,669 B2 | 3/2021 | Zhang et al. |
| 2008/0052446 A1* | 2/2008 | Lasser ................. G06F 12/0246 711/E12.008 |
| 2017/0069390 A1 | 3/2017 | Nam et al. |
| 2018/0024777 A1 | 1/2018 | Higgins et al. |
| 2019/0004734 A1* | 1/2019 | Kirshenbaum ....... G06F 3/0679 |
| 2019/0087327 A1 | 3/2019 | Kanno et al. |
| 2019/0220397 A1 | 7/2019 | Lee |
| 2019/0250822 A1 | 8/2019 | Choi |
| 2020/0027519 A1 | 1/2020 | Zhang et al. |
| 2020/0110545 A1 | 4/2020 | Choi et al. |
| 2021/0072896 A1* | 3/2021 | Byun ..................... G11C 29/24 |
| 2021/0166774 A1 | 6/2021 | Cha et al. |

* cited by examiner

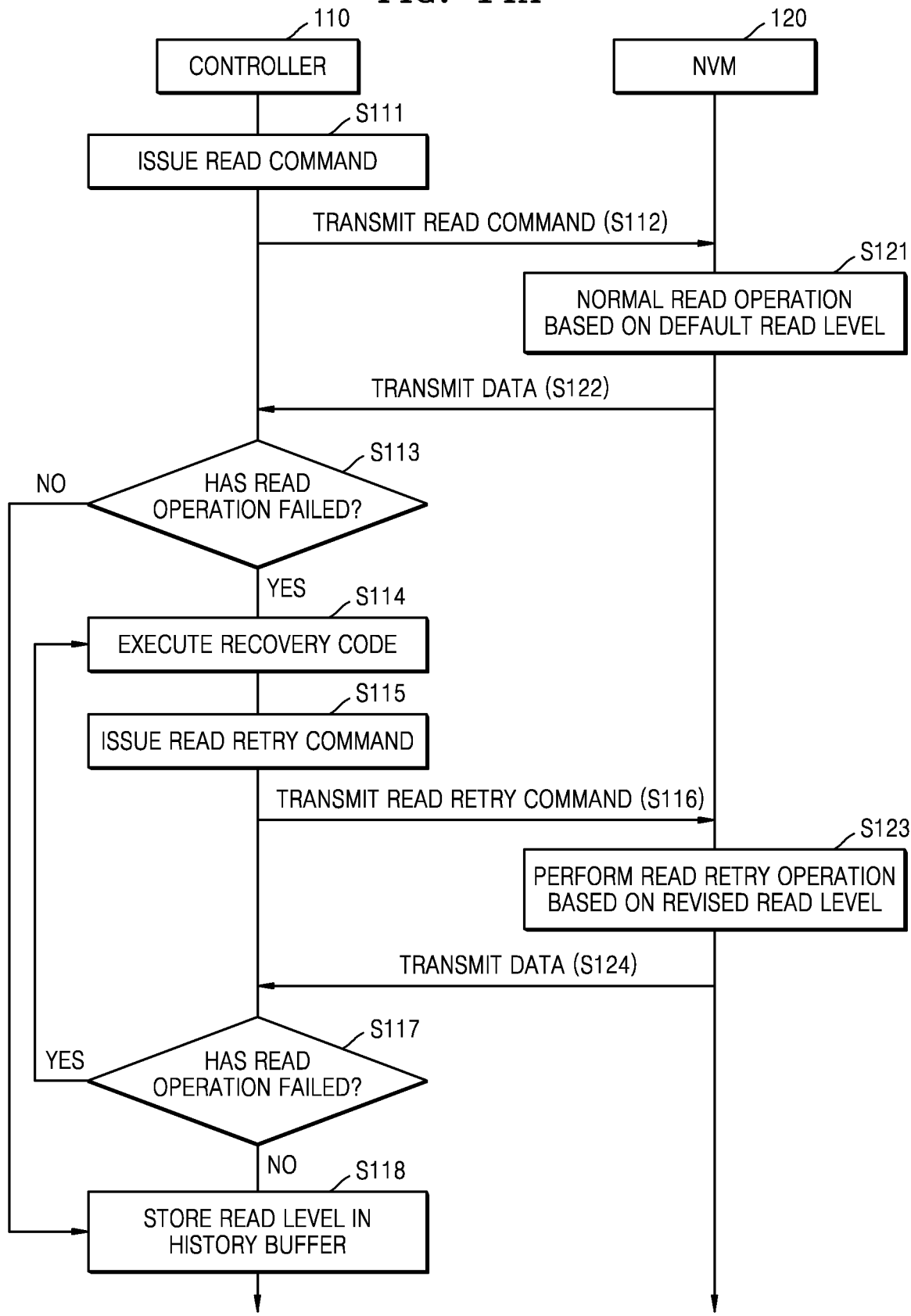

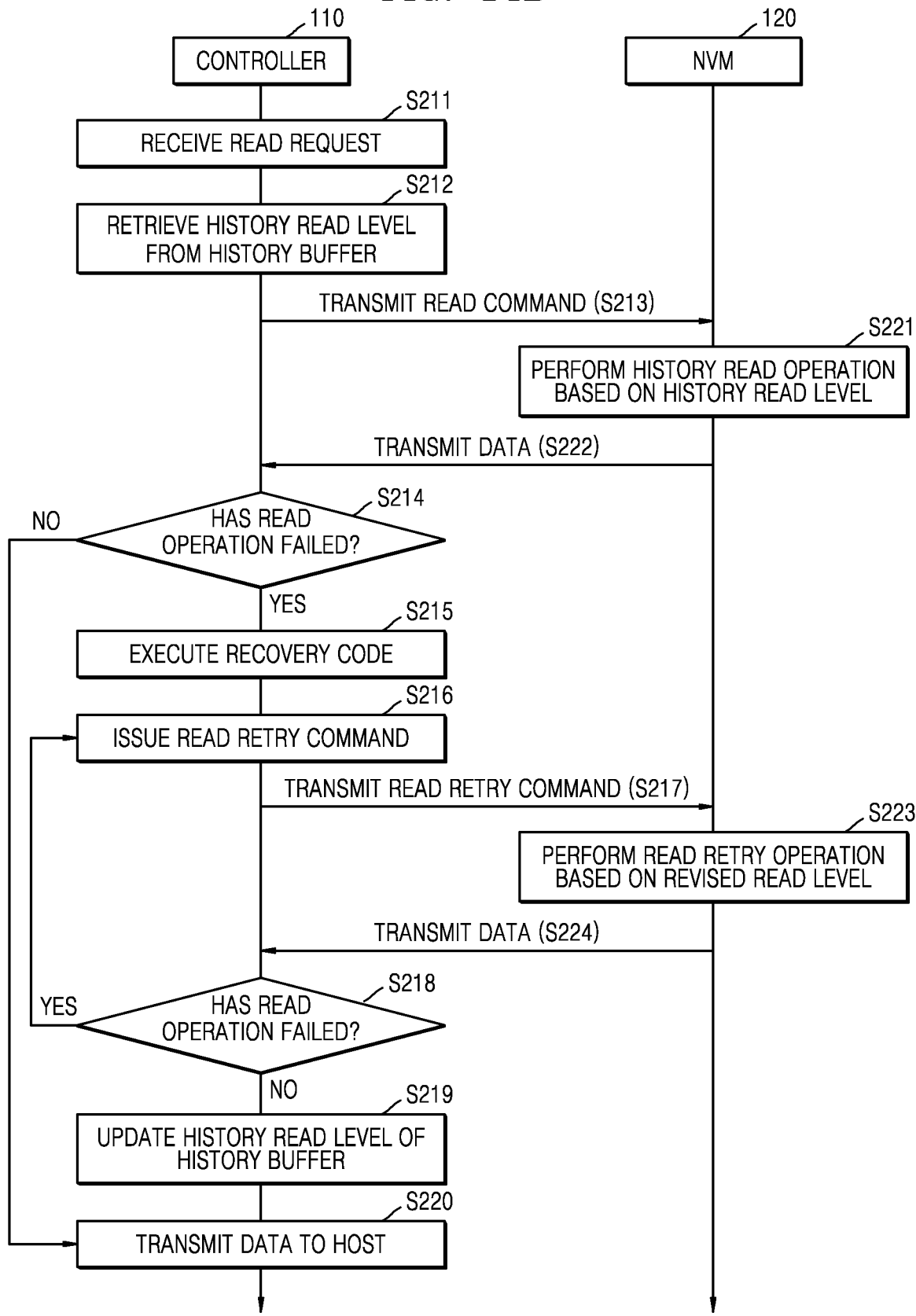

FIG. 19B
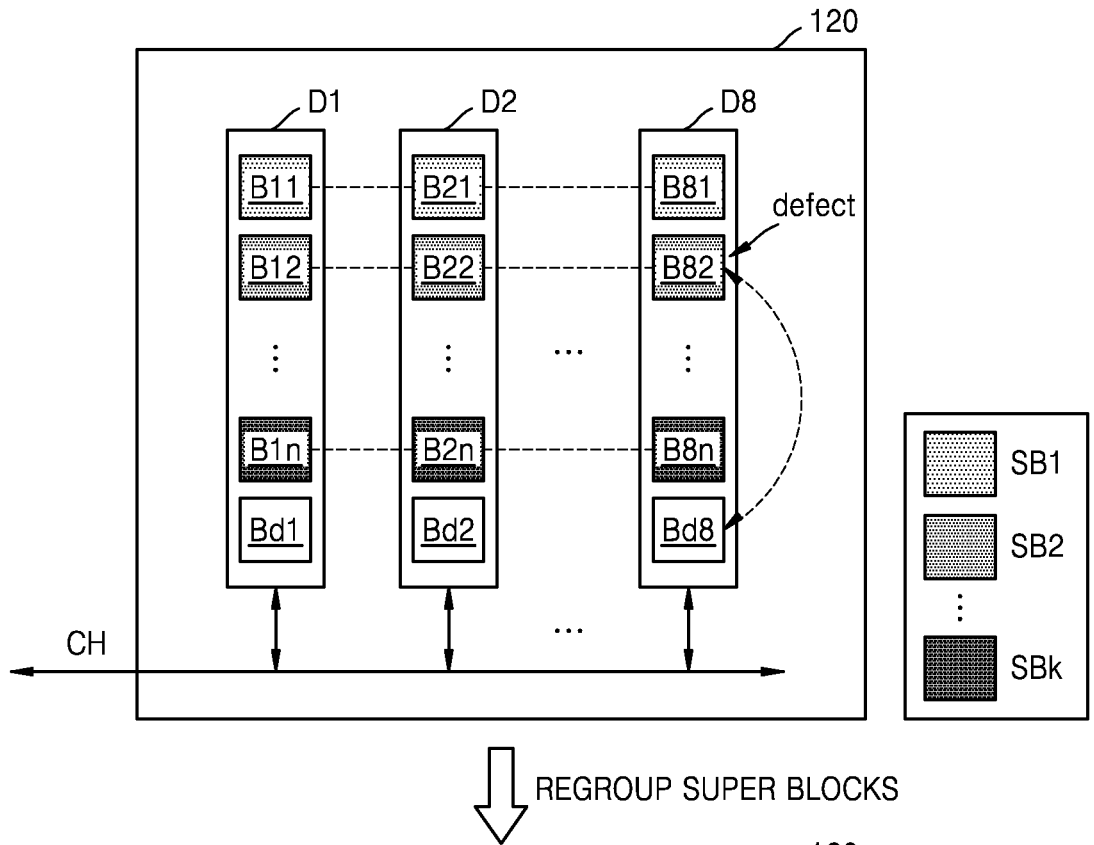
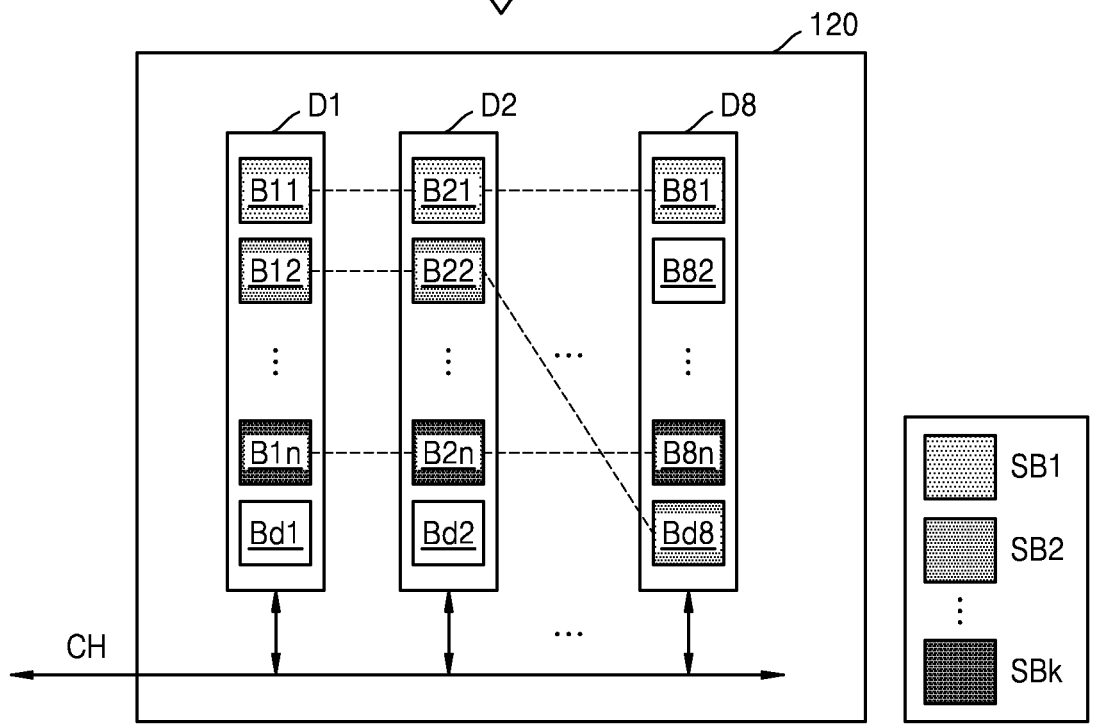

STORAGE DEVICE AND METHOD OF OPERATING THE SAME

CROSS-REFERENCE TO RELATED APPLICATION

This U.S. non-provisional patent application is a continuation application of U.S. patent application Ser. No. 17/038,416 filed Sep. 30, 2020, which claims the benefit of priority under 35 U.S.C. § 119 to Korean Patent Application No. 10-2019-0158459, filed on Dec. 2, 2019, in the Korean Intellectual Property Office, the disclosure of which is incorporated by reference in its entirety herein.

BACKGROUND

1. Technical Field

The inventive concept relates to a memory device, and more particularly, to a storage device including a non-volatile memory and a method of operating the storage device.

2. Discussion of Related Art

A flash memory is a non-volatile memory, which retains stored data even if a power supply is interrupted. Flash memory has the ability to be electrically reprogrammed and erased. In recent years, storage devices including flash memories, such as solid-state drives (SSDs) and memory cards, have widely been used. A flash memory includes a plurality of memory cells. A flash memory may store data by varying threshold voltages of the memory cells. Data may be read from the flash memory by sensing the threshold voltages and comparing the sensed voltages to one or more predetermined read levels. However, the threshold voltages of the memory cells may be changed due to degradation of the memory cells, and thus, read errors may occur.

SUMMARY

At least one embodiment of the inventive concept provides a storage device, which may require less read retry operations, include a lower capacity history buffer and prevent performance degradation, and a method of operating the storage device.

According to an exemplary embodiment of the inventive concept, there is provided a method of operating a storage device including a non-volatile memory. The method includes storing program and erase counts of the non-volatile memory as metadata in units of super blocks, wherein each of the super blocks includes a pre-defined number of blocks of the non-volatile memory, performing a read operation on a first block included in a first super block, based on a first read level, storing the first read level as a history read level of the first super block in a history buffer when the read operation on the first block is successful, receiving a read request for a second block of the first super block and an address of the second block from a host, and performing a read operation on the second block based on the history read level stored in the history buffer. The pre-defined number is at least two.

According to an exemplary embodiment of the inventive concept, there is provided a storage device including a non-volatile memory including a plurality of physical blocks, and a controller configured to group the plurality of physical blocks into a plurality of groups, store program and erase counts of each of the plurality of groups as metadata, store a read level of each of the plurality of groups in a history buffer, and, when a read command and an address are received from a host, control the non-volatile memory to perform a read operation on a selected physical block among the physical blocks corresponding to the address, based on a corresponding read level of a plurality of read levels stored in the history buffer, when a read command and the address are received from a host.

According to an exemplary embodiment of the inventive concept, there is provided a method of operating a storage device including a non-volatile memory having a plurality of memory blocks divided into a plurality of memory groups. The method includes performing a read operation on a first block included in a first memory group, from among the plurality of memory groups, based on a first read level, storing the first read level as a read level of the first memory group in a history buffer when the read operation on the first block is successful, receiving a read request for a second block included in the first memory group and an address of the second block from a host, determining a second read level based on the first read level stored in the history buffer and an offset indicating differences in characteristics between the first block and the second block, and performing a read operation on the second block based on the second read level.

According to an exemplary embodiment of the inventive concept, there is provided a method of operating a storage device including a non-volatile memory. The method includes grouping a plurality of physical blocks of the non-volatile memory into a plurality of memory groups based on characteristic information about each of the plurality of physical blocks, receiving a read request for a first physical block included in a first memory group of the plurality of memory groups from a host, ascertaining whether a read level corresponding to the first memory group is stored in a history buffer, performing a read operation on the first physical block based on a default read level when the read level is not stored in the history buffer, and performing a read operation on the first physical block based on the read level when the read level is stored in the history buffer. A degradation degree is managed for each of the plurality of memory groups that indicate relative degrees of degradation between the memory groups.

BRIEF DESCRIPTION OF THE DRAWINGS

Embodiments of the inventive concept will be more clearly understood from the following detailed description taken in conjunction with the accompanying drawings in which:

FIGS. 14A and 14B illustrate operations of a controller and a non-volatile memory of a storage device, according to exemplary embodiments of the inventive concept;

FIGS. 19A and 19B illustrate examples of the regrouping method of FIG. 18;

DETAILED DESCRIPTION OF THE EMBODIMENTS

Figure 1:
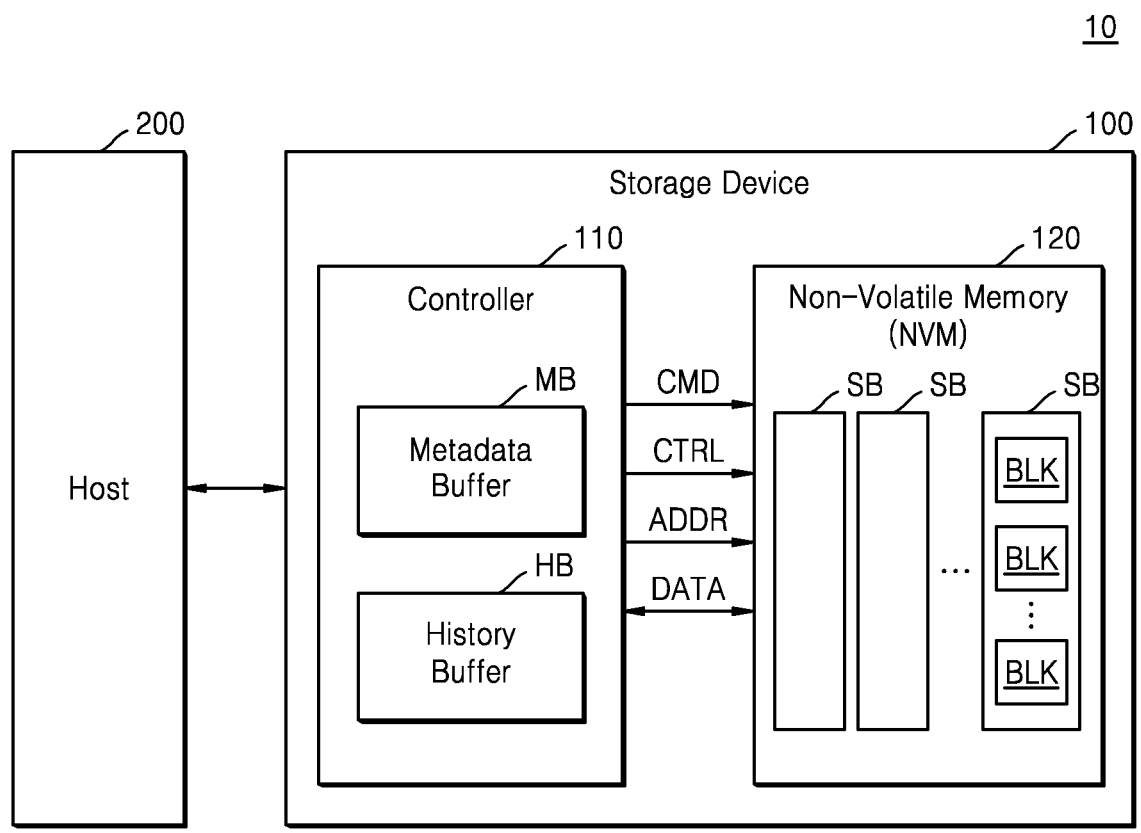
FIG. 1 is a block diagram of a storage system according to an exemplary embodiment of the inventive concept.

FIG. 1 is a block diagram of a storage system 10 according to an exemplary embodiment of the inventive concept.

Referring to FIG. 1, the storage system 10 includes a storage device 100 and a host 200 (e.g., a host device). The storage device 100 includes a controller 110 (e.g., a control circuit or a memory controller) and a non-volatile memory (NVM) 120. The controller 110 may output a command CMD, and address ADDR, a control signal CTRL signal to the NVM 120, and exchange data DATA with the NVM 120. The host 200 may communicate with the storage device 100 through various interfaces and transmit a read request and a write request to the storage device 100. In an embodiment, the host 200 may be implemented as an application processor (AP) or a system-on-chip (SoC).

The NVM 120 may include a plurality of memory blocks BLK, which may be grouped into a plurality of super blocks SB. The memory block BLK may refer to a physical block. Each physical block may include a plurality of memory cells. Hereinafter, the memory block BLK may be referred to as a block or a physical block. The super block SB may be a unit of a logical memory region required for the controller 110 to manage the NVM 120, and each of the plurality of super blocks SB may include a plurality of memory blocks BLK. In an exemplary embodiment, each super block SB includes a same number of memory blocks BLK and that number can be adjusted as needed.

The memory block BLK may be implemented as a memory cell array in which a plurality of memory cells form a two-dimensional (2D) or three-dimensional (3D) array structure. The plurality of memory cells may be single-level cells programmed with one bit or multi-level cells (e.g., double-level cells, triple-level cells or quadruple-level cells) programmed with two bits or more. The memory cells may be NAND flash memory cells. However, the inventive concept is not limited thereto, and the memory cells may be resistive memory cells, such as resistive RAM (ReRAM) cells, phase-change RAM (PRAM) cells, or magnetic RAM (MRAM) cells.

The block BLK may include a plurality of pages. Memory cells connected to a same word line may constitute a page. For example, the block BLK may be a unit of an erase operation, and the page may be a unit of program and read operations.

The controller 110 (or a storage controller) may control the overall operation of the storage device 100. The controller 110 may control the NVM 120 to read data DATA stored in the NVM 120 in response to a read request from the host 200 or program data DATA in the NVM 120 in response to a write request from the host 200. Also, the controller 110 may control the NVM 120 to perform an internal management operation or a background operation of the storage device 100 regardless of the request of the host 200.

In the present embodiment, the controller 110 includes a metadata buffer MB and a history buffer HB. The controller 110 manages the metadata buffer MB and the history buffer HB in units of predetermined memory groups (e.g., super blocks SB). In an exemplary embodiment, the controller 110 groups the plurality of blocks BLK into a plurality of super blocks SB based on positions of the blocks BLK in a memory device or groups the plurality of blocks BLK into the plurality of super blocks SB based on electrical characteristics of the plurality of blocks BLK (e.g., threshold-voltage distribution characteristics of the plurality of blocks BLK during the application of a same test program voltage).

Various kinds of pieces of metadata may be stored in the metadata buffer MB. Here, the metadata may be user data stored in the NVM 120 or data generated by the controller 110 to manage the NVM 120. For example, the metadata may include mapping information used to convert a logical address of the host 200 into a physical address of the NVM 120. Alternatively, the metadata may include information (e.g., a program and erase (P/E) cycle, program and erase counts and degradation degree information) for an operation of managing a memory space of the NVM 120, such as a wear-leveling process and a garbage collection process. For example, the wear-leveling process may include ensuring that writes are distributed uniformly to prolong the life of the memory device. For example, the garbage collection process may include moving valid pages of first memory blocks to a second memory block and then erasing the first memory blocks to free up space. When the storage device 100 is powered off and then powered on again, the metadata may be continuously used. Thus, the metadata may be stored in the NVM 120 during a runtime of the storage device 100 or when the storage device 100 is powered off. For example, the metadata can be retained even after the storage device 100 is powered off.

The controller 110 may control the NVM 120 such that the plurality of memory blocks BLK included in the super block SB perform program and/or erase operations at a same point in time. Also, the controller 110 may manage (or store and update) metadata related to the management of a degradation degree of the NVM 120 in units of super blocks SB. For example, a different degradation degree (or degree of degradation) may be stored and updated for each of the super blocks SB. The degradation degrees may indicate how degraded the super blocks have become relative to one another. For example, if a first degradation degree of a first super block is higher than a second degradation degree of a second super block, the first super block is considered more degraded than the second super block. For example, the first super block could have been programmed and/or erased many more times than the second super block to be considered as having a higher degradation degree.

For instance, when the logical address received from the host 200 along with the write request is converted into a physical address, the controller 110 may map the physical address to the logical address such that the plurality of blocks BLK of the super block SB simultaneously perform program operations using an interleaving method. Thus, the plurality of blocks BLK of the super block SB may have the same degradation degree or similar degradation degrees. Herein, the degradation of a memory cell may indicate that the physical characteristics of the memory cell are changed as a P/E cycle is repeated. As the memory cell is degraded, endurance and retention characteristics of the memory cell may be lowered. Since the plurality of blocks BLK of the super block SB have the same degradation degree or similar degradation degrees, the controller 110 may manage the metadata related to the degradation degree in the units of super blocks SB.

In an exemplary embodiment, the controller 110 manages a P/E cycle in units of super blocks SB, and stores program and erase counts in the metadata buffer MB for each super block SB. Alternatively, the controller 110 may detect a degradation degree of each super block SB and store the detected degradation degree in the metadata buffer MB. As described above, the metadata may be managed in the units of super blocks SB, and thus, a storage capacity of the metadata buffer MB required for storing the metadata may be reduced.

In addition, the controller 110 may store a read level of each super block SB in the history buffer HB during the runtime of the storage device 100. For example, the read level may be a certain voltage or current. When a read request is received from the host 200, data may be read from the block BLK that is requested to be read based on the read level stored in the history buffer HB. As used herein, the read level stored in the history buffer HB will be referred to as a "history read level," and a read operation based on the history read level will be referred to as a "history read operation."

For example, the controller 110 may perform a read operation on one memory block BLK (e.g., a first block) of a first super block based on a first read level. When the read operation is successful, the first read level is stored as the history read level of the first super block in the history buffer HB. Thereafter, when a read request for the first block or another block of the first super block is received from the host 200, the controller 110 performs a history read operation based on the history read level of the first super block stored in the history buffer HB.

When the read operation fails, the controller 110 may perform a read retry operation. When the previous read operation fails, the read level may be revised. Hereinafter, a read operation performed using the revised read level will be referred to as a "read retry operation." In an exemplary embodiment, performing of the read operation includes reading cell voltages of a memory block, converting the read voltages into a codeword (e.g., data and redundancy information), performing an error checking and correction (ECC) operation on the codeword, and the read operation fails when the ECC operation fails. For example, an ECC operation failure may indicate that the codeword has a certain number of errors that exceeded the error correcting capability of the ECC operation. The converting of the read voltages into the codeword may use the read level. If the ECC operation fails, the read level used can be increased or decreased to the revised read level, the codeword can be revised using the previously read cell voltages and the revised read level, and the ECC operation can be performed on the revised codeword. When the history read operation fails, the controller 110 may execute recovery code by firmware to derive a revised read level, and perform a read retry operation based on the revised read level. When the read retry operation is successful, the controller 110 may store the revised read level as a history read level in the history buffer HB and update the history read level.

When a read operation is performed based on a default read level in which a degradation degree of the block BLK is not detected, the probability that the read operation will fail may be high. However, the storage device 100 according to at least one embodiment of the present inventive concept may manage the history read level in the units of super blocks SB and perform the history read operation on the block BLK, which has been requested to be read, based on the history read level of the corresponding super block SB. Thus, the probability that the read operation will be successful may be increased. As described above, when the read operation fails, the recovery code may be executed. However, the execution of the recovery code may take a large amount. The storage device 100 according to an exemplary embodiment of the inventive concept may minimize a execution time of the recovery code, and thus, the performance of the storage device 100 may be improved.

Furthermore, when an excessively long time elapses since the history read level is stored in the history buffer HB, the probability that the read operation will fail may be high even if the history read operation is performed based on the history read level. When the storage device 100 is powered off, an elapsed time until the storage device 100 is powered on again may be unknown and sometimes quite long. Accordingly, when the storage device 100 is powered off, unlike the metadata, data stored in the history buffer HB (i.e., the history read level of each super block SB) may not need to be stored in the NVM 120. When the storage device 100 is powered on and a normal read operation (e.g., a read operation performed based on a default read level) is successful, the read level may be stored as a history read level in the history buffer HB, used during the runtime of the storage device 100, and also updated. In an exemplary embodiment, the history read levels are stored in a volatile memory (not shown) of the storage device, the default read levels are initially used after the storage device 100 is powered on, and continue to be used until respective history read levels have been newly calculated.

In an exemplary embodiment, during the history read operation, to compensate for differences in characteristics between a plurality of blocks BLK included in the same super block SB or differences in characteristics between a plurality of memory devices respectively including the plurality of blocks BLK, the controller 110 adds an offset to the history read level to generate an adjusted history read level, calculate an adjusted read level from the adjusted history read level, and perform the history read operation based on the adjusted read level.

The plurality of blocks BLK included in the same super block SB may differ in electrical characteristics due to manufacturing processes (i.e., manufacturing operations). For example, threshold-voltage distribution characteristics (e.g., a width of a threshold voltage distribution and a threshold voltage level) of the first block may be different from those of a second block. Thus, even if the first block and the second block have the same degradation degree or similar degradation degrees, the first block and the second block may have different retention characteristics.

Therefore, the controller 110 may perform the history read operation based on the adjusted read level that is obtained by adding an offset in which differences in characteristics between the plurality of blocks BLK are reflected, to the history read level. As a result, a read success rate may be increased, and a recovery code execution time may be reduced.

In an exemplary embodiment, the controller 110 performs a background read operation in units of super blocks SB and updates the history buffer HB. In this case, the "background read operation" may indicate that the controller 110 issues a read command CMD and an address ADD by itself without receiving a read request from the host 200 and reads data DATA from the NVM 120 in response to the read command CMD and the address ADDR. In an embodiment, the "background read operation" performed to update the history buffer HB may be performed on one block (e.g., a representative block) of the super block SB based on the history read level stored in the history buffer HB. For example, the storage device 100 has been just powered on, the controller 110 could perform one or more background read operations to update the history buffer HB.

In an embodiment, the controller 110 performs the background read operation in units of blocks BLK and regroups the super block or replaces a defective block BLK, out of the blocks BLK included in the super block SB, by another block, based on characteristics of the plurality of blocks BLK, which are detected based on the results of the background read operation. For example, if one of the blocks assigned to a super block is determined to be defective, another block of the memory 120 may be assigned to the super block The storage system 10 may be implemented as, for example, a personal computer (PC), a data server, a network-coupled storage (NAS), an Internet of Things (IoT) device, or a portable electronic device. The portable electronic device may include a laptop computer, a mobile phone, a smartphone, a tablet PC, a personal digital assistant (PDA), an enterprise digital assistant (EDA), a digital still camera, a digital video camera, an audio device, a portable multimedia player (PMP), a personal navigation device (PND), an MPEG-1 audio layer 3 (MP3) player, a handheld game console, an electronic book (e-book), and a wearable device.

In some embodiments, the storage device 100 may be an internal memory that is embedded in an electronic device. For example, the storage device 100 may be a solid-state drive (SSD), an embedded universal flash storage (UFS) memory device, or an embedded multi-media card (eMMC). In some embodiments, the storage device 100 may be an external memory that is detachably attached to an electronic device. For example, the storage device 100 may include a UFS memory card, a compact flash (CF) memory, a secure digital (SD) memory, a micro-SD memory, a mini-SD memory, an extreme digital (xD) memory, or a memory stick.

Figure 2A:
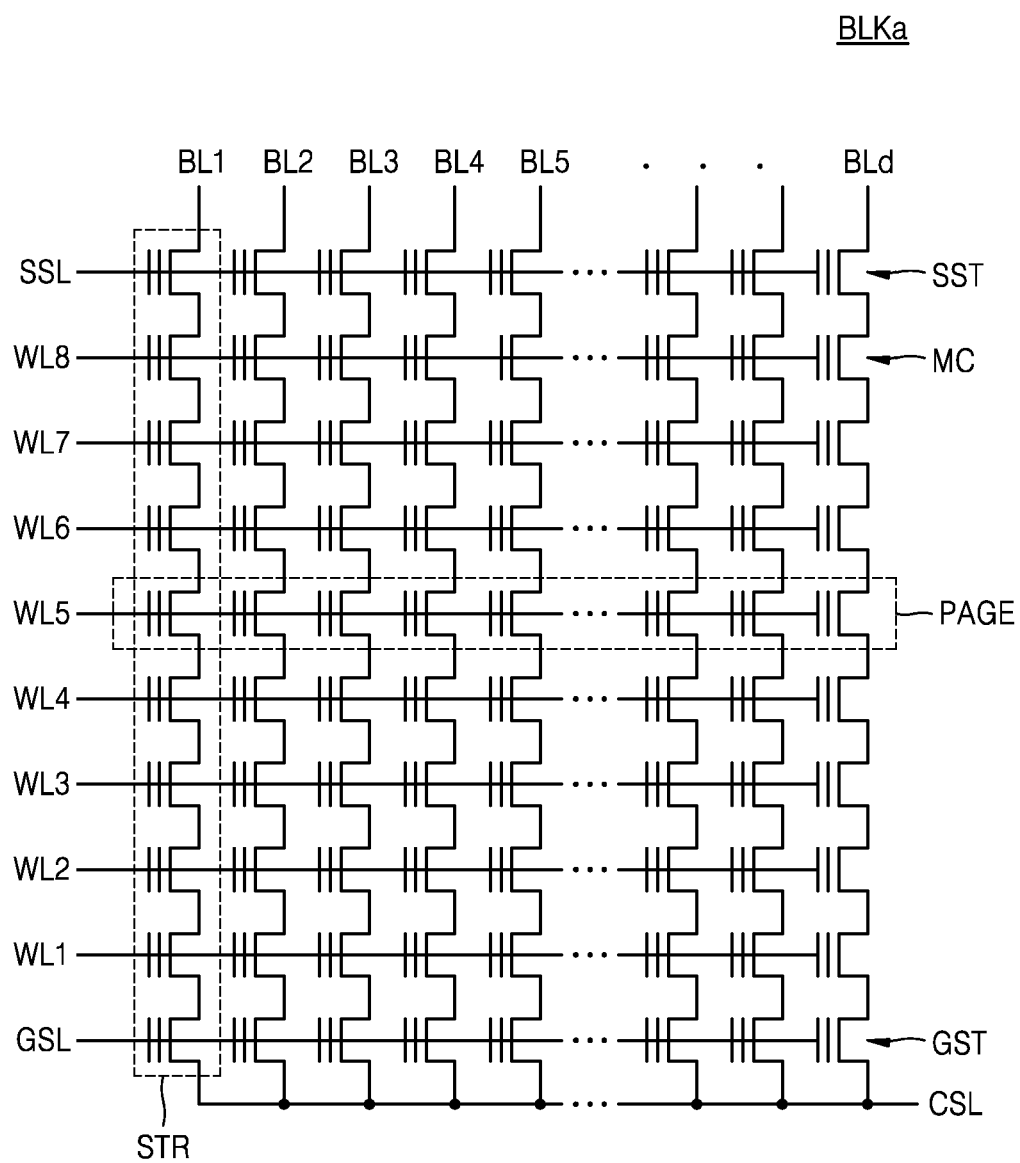
FIGS. 2A and 2B are circuit diagrams of an example of a block of a non-volatile memory of FIG. 1, according to an exemplary embodiment of the inventive concept.
Figure 2B:
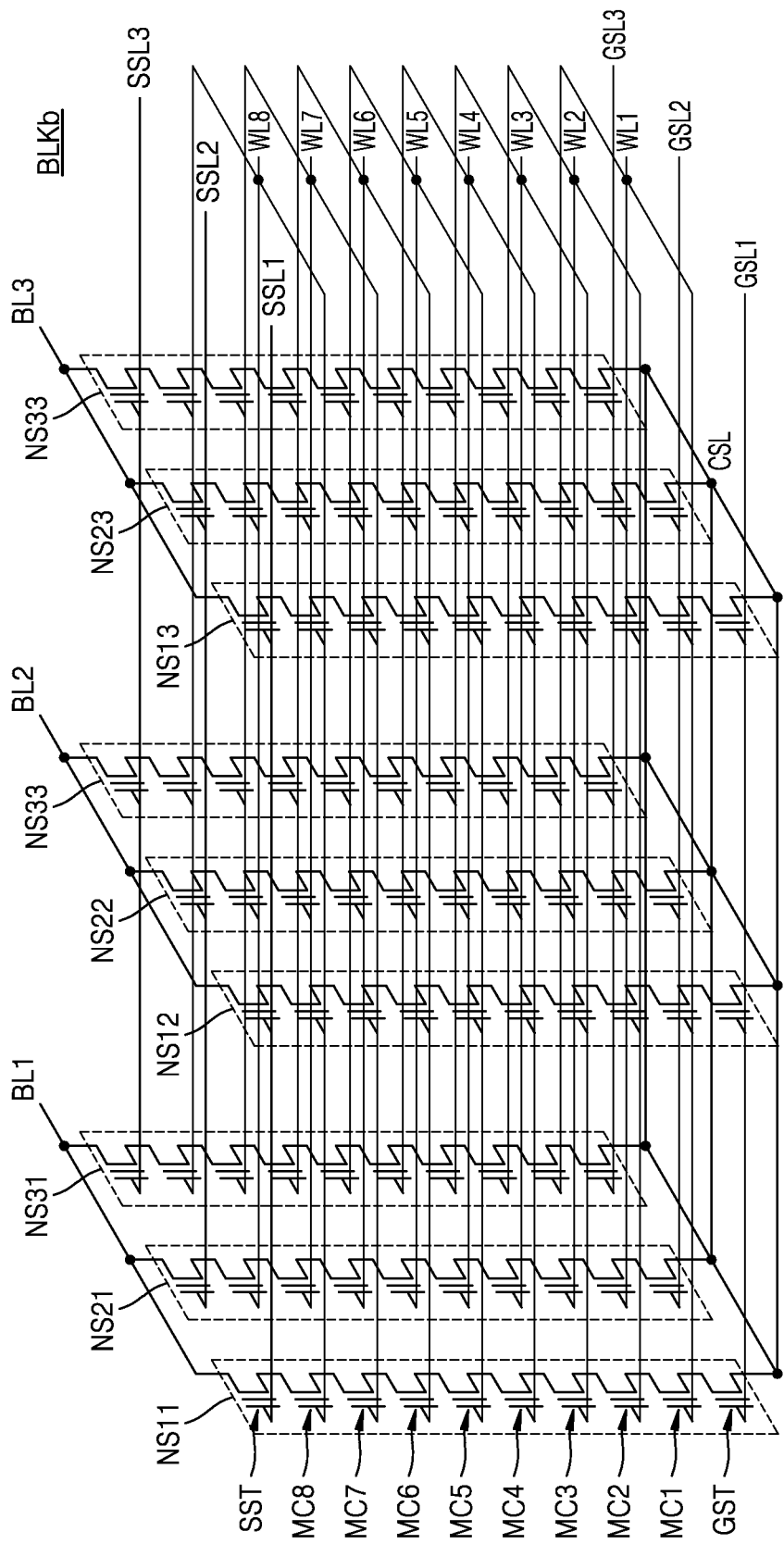

FIGS. 2A and 2B are circuit diagrams of examples of the block BLK of the NVM 120 of FIG. 1, according to exemplary embodiments of the inventive concept.

Referring to FIG. 2A, a block BLKa may be a horizontal NAND flash memory. The block BLKa includes a plurality of NAND strings STR, a plurality of word lines (e.g., first to eighth word lines WL1 to WL8), a plurality of bit lines BL1 to BLd, a ground selection line GSL, a string selection line SSL, and a common source line CSL. Here, the number of NAND strings, the number of word lines, the number of bit lines, the number of ground selection lines, and the number of string selection lines may be variously changed according to embodiments.

Memory cells MC connected to one word line (e.g., the fifth word line WL5) may constitute a page PAGE, and program and read operations may be performed in units of pages. In this case, the page PAGE shown in FIG. 2A may indicate a physical page. When the memory cells MC are multi-level cells, a plurality of logical pages may be programmed to the page PAGE. Program and read operations may be performed in units of a page PAGE corresponding to each of the first to eighth word lines WL1 to WL8, and an erase operation may be performed on the entire block BLKa.

Referring to FIG. 2B, a block BLKb may be a vertical NAND flash memory. The block BLKb may include a plurality of NAND strings (e.g., NS11 to NS33), a plurality of word lines (e.g., first to eighth word lines WL1 to WL8), a plurality of bit lines (e.g., first to third bit lines BL1 to BL3), a plurality of ground selection lines (e.g., GSL1 to GSL3), a plurality of string selection lines (e.g., first to third SSL1 to SSL3), and a common source line CSL. Here, the number of NAND strings, the number of word lines, the number of bit lines, the number of ground selection lines, and the number of string selection lines may be variously changed according to embodiments.

NAND strings NS11, NS21, and NS31 may be provided between the first bit line BL1 and the common source line CSL, and NAND strings NS12, NS22, and NS32 may be provided between the second bit line BL2 and the common source line CSL. NAND strings NS13, NS23, and NS33 may be provided between the third bit line BL3 and the common source line CSL. Each NAND string (e.g., NS11) may include a string selection transistor SST, a plurality of memory cells (e.g., MC1 to MC8), and a ground selection transistor GST, which are connected in series.

The string selection transistor SST may be connected to the first to third string selection lines SSL1 to SSL3. The memory cells MC1 to MC8 may be connected to the first to eighth word lines WL1 to WL8 corresponding respectively thereto. The ground selection transistor GST may be connected to the ground selection lines GSL1, GSL2, and GSL3. The string selection transistor SST may be connected to a bit line BL corresponding thereto, and the ground selection transistor GST may be connected to the common source line CSL.

Word lines connected to memory cells located at the same level in the NAND strings NS11 to NS33 may be connected in common, and the first to third string selection lines SSL1 to SSL3 may be separated from each other. For example, when memory cells that are connected to the first word line WL1 and belong to the NAND strings NS11, NS12, and NS13 are programmed, the first word line WL1 and the first string selection line SSL1 may be selected. As shown in FIG. 2B, the ground selection lines GSL1, GSL2, and GSL3 may be separated from each other. However, the inventive concept is not limited thereto, and the ground selection lines GSL1, GSL2, and GSL3 may be connected to each other.

Program and read operations may be performed in units of pages PAGE corresponding respectively to the first to eighth word lines WL1 to WL8 and the NAND strings NS11 to NS33, and an erase operation may be performed on the entire block BLKb.

Figure 3A:
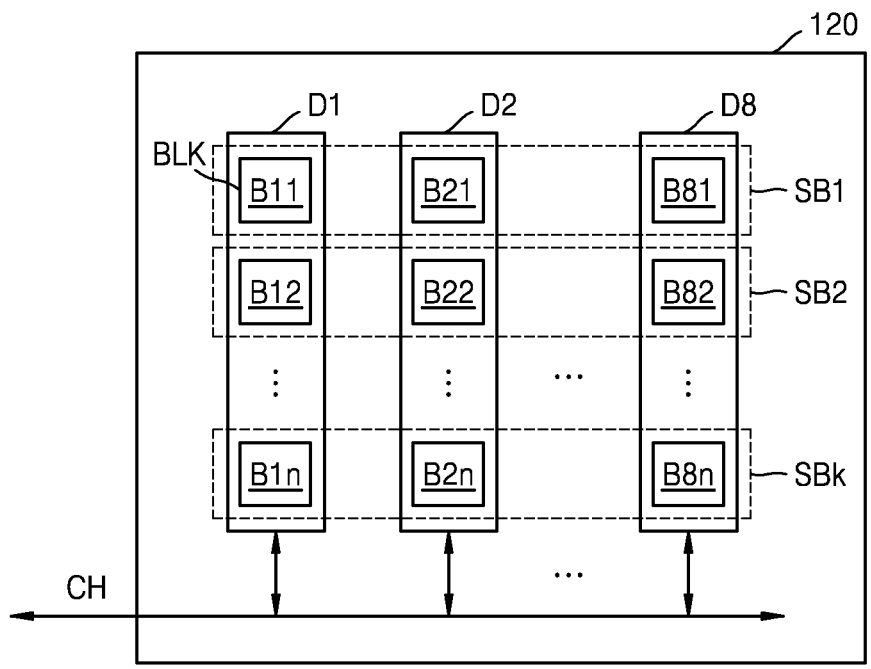
FIGS. 3A and 3B are block diagrams illustrating methods of grouping super blocks in a non-volatile memory (NVM) of FIG. 1, according to exemplary embodiments of the inventive concept.
Figure 3B:
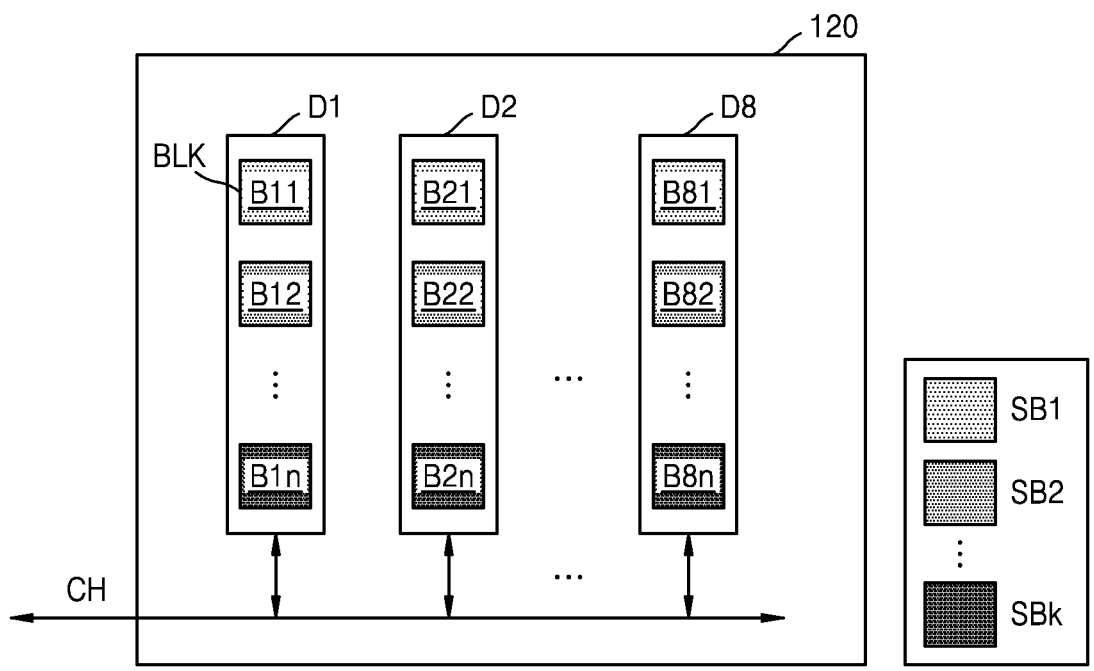

FIGS. 3A and 3B are block diagrams illustrating methods of grouping super blocks in the NVM 120 of FIG. 1, according to exemplary embodiments of the inventive concept.

Referring to FIGS. 1 and 3A, the NVM 120 includes a plurality of memory devices (e.g., first to eighth memory devices D1 to D8). The first to eighth memory devices D1 to D8 may communicate with the controller 110 through at least one channel CH. Each of the first to eighth memory devices D1 to D8 may be a semiconductor chip or a semiconductor die and include a plurality of blocks BLK. For example, as shown in FIG. 3A, the first to eighth memory devices D1 to D8 may respectively include n blocks B11 to B1n, B21 to B2n, . . . , and B81 to B8n (n is a natural number greater than or equal to 2). Although not shown, each of the first to eighth memory devices D1 to D8 may further include peripheral circuits (e.g., a voltage generator, an address decoder, and an input/output (I/O) circuit) configured to perform program, read, and erase operations.

From among the first to eighth memory devices D1 to D8, blocks BLK arranged at the same position (or blocks BLK to which the same number is assigned) may be grouped into one super block. For example, as shown in FIG. 3A, the blocks B11 to B81 may be grouped into a first super block SB1, the blocks B12 to B82 may be grouped into a second super block SB2, and blocks B1n to B8n may be grouped into an n-th super block SBk (here, k is a natural number more than or equal to 2 and less than or equal to n).

Referring to FIG. 3B, a plurality of blocks B11 to B8n may be grouped into a plurality of super blocks (i.e., first to k-th super blocks SB1 to SBk) based on electrical characteristics. For example, the blocks B11, B21, . . . , and B81 may have equal or similar electrical characteristics and be grouped into the first super block SB1, and the blocks B12, B22, . . . , and B82 may have equal or similar electrical characteristics and be grouped into the second super block SB2. Also, the blocks B1n, B2n, . . . , and B8n may have equal or similar electrical characteristics and be grouped into an n-th super block SBn.

In addition to the grouping methods described with reference to FIGS. 3A and 3B, the plurality of blocks BLK of the NVM 120 may be grouped into a plurality of super blocks based on various conditions. Although FIGS. 3A and 3B illustrate an example in which the first to eighth memory devices D1 to D8 are connected in parallel to the one channel CH and communicate with the controller 110 through the channel CH, the inventive concept is not limited thereto. For example, the NVM 120 may include a plurality of channels connected respectively to a plurality of memory devices. In an exemplary embodiment, the first to eighth memory devices D1 to D8 connected to the same channel CH perform program, read, and erase operations using an interleaving method.

Figure 4A:
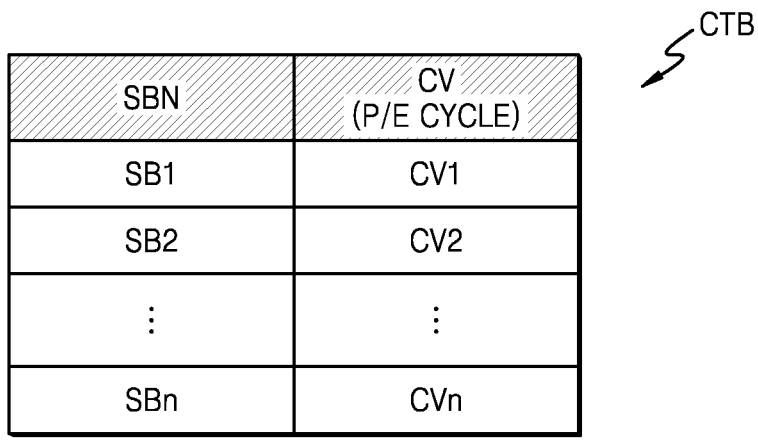
FIGS. 4A and 4B illustrate examples of a metadata table stored in a metadata buffer, according to an exemplary embodiment of the inventive concept.
Figure 4B:
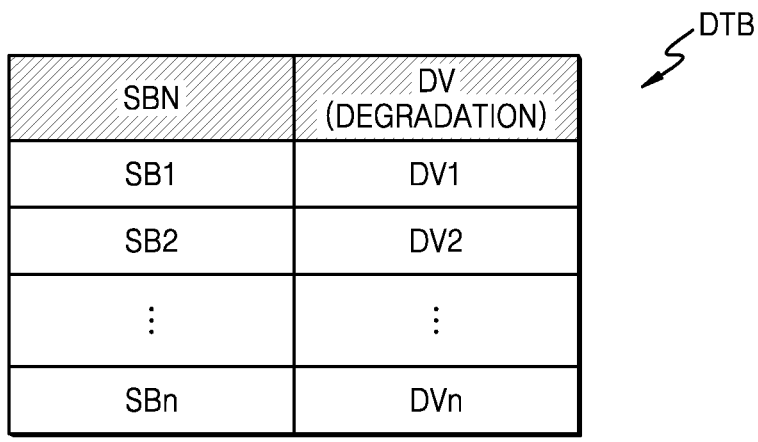

FIGS. 4A and 4B illustrate examples of a metadata table stored in a metadata buffer, according to an exemplary embodiment of the inventive concept.

Referring to FIG. 4A, a P/E cycle of each of a plurality of super blocks (e.g., first to n-th super blocks SB1 to SBn) is stored as a counting table CTB in the metadata buffer (refer to MB in FIG. 1).

For example, each entry of the counting table CTB may include a super block number SBN, which is a super block address of an NVM 120, and a counting value CV indicating a P/E cycle. The counting table CTB may store a plurality of counting values (e.g., first to n-th counting values CV1 to CVn) corresponding respectively to the first to n-th super blocks SB1 to SBn. For instance, a controller 110 may count a P/E cycle (or the number of times program and erase operations are repeated) of a plurality of memory blocks of the first super block SB1 and store the counting result as the first counting value CV1 in the counting value CV. For example, a superblock address could include physical addresses of each block assigned to a given superblock. For example, the counting value associated with a superblock could be incremented each time any of the blocks of the superblock are programmed or erased.

Referring to FIG. 4B, a degradation value DV indicating a degradation degree of each of a plurality of super blocks SB1 to SBn is stored as a degradation degree table DTB in the metadata buffer MB. In this case, a degradation degree may refer to a degree to which each of the plurality of super blocks SB1 to SBn is degraded due to the repetition of program and erase operations. For example, the degradation degree table DTB may include a super block number SBN, which is a super block address of the NVM 120 and a degradation value DV. The degradation degree table DTB may store a plurality of degradation values DV1 to DVn corresponding respectively to the plurality of super blocks SB1 to SBn. For example, the controller 110 may periodically or aperiodically detect the degradation degree of each of the plurality of super blocks SB1 to SBn and store the degradation degree or a processing value calculated based on the degradation degree as the degradation value DV in the degradation degree table DTB.

Figures 5, 6A:
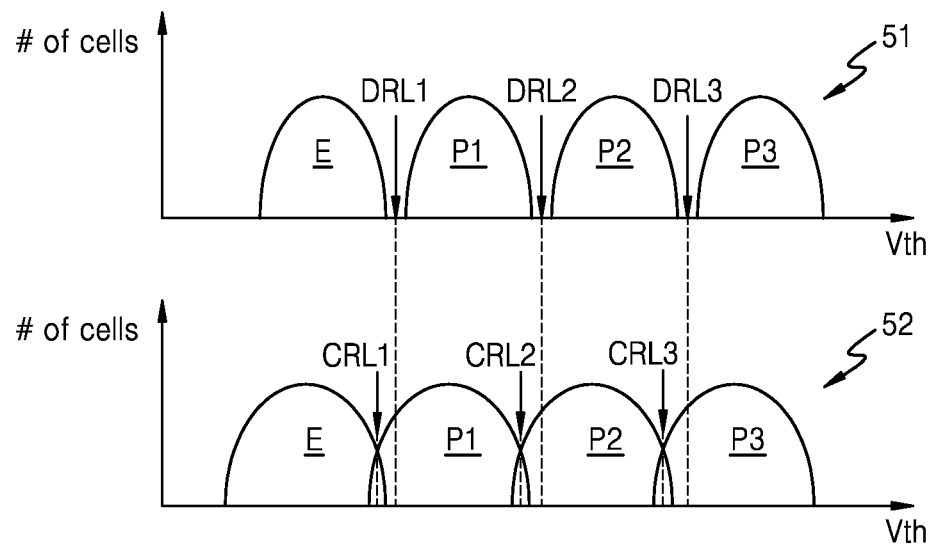
FIG. 5 is a graph showing an example of a variation in a threshold voltage distribution relative to the degradation of memory cells included in an NVM.
FIGS. 6A, 6B, and 6C illustrate examples of a read history table corresponding to the variation in the distribution of FIG. 5, according to exemplary embodiments of the inventive concept.

FIG. 5 is a graph showing an example of a variation in threshold voltage distribution relative to the degradation of memory cells included in an NVM.

Referring to FIGS. 1 and 5, in an initial distribution 51 and a changed distribution 52, the abscissa denotes a threshold voltage Vth and the ordinate denotes the number of memory cells.

For example, when memory cells are multi-level cells programmed with 2 bits, the memory cells may have one of an erase state E and first to third program states P1 to P3. The initial distribution 51 may be a distribution obtained within a predetermined time after a program operation on the memory cells has completed. The storage device 100 may use first to third default read levels DRL1 to DRL3 to determine the first to third program states P1 to P3, respectively.

The changed distribution 52 may be a distribution obtained after a predetermined time since the program operation on the memory cells has completed. When a retention time increases, the amount of charges trapped in the memory cells may be reduced, and thus, the distribution may be changed and shifted. Accordingly, the threshold voltage Vth of the memory cells may be changed as compared to the initial distribution 51. Specifically, as the retention time increases, charges stored in charge storage layers of the memory cells may leak to a substrate, and thus, the threshold voltage Vth of the memory cells may be reduced. The change and shift in the distribution may be affected not only by an elapsed time (i.e., the retention time) after the program operation but also by program and/or erase iterations (e.g., a P/E cycle). For example, even if the same time elapses after program operations on a first word line and a second word line have completed, a P/E cycle of the first word line is different from a P/E time of the second word line, and a change and shift in distribution of the first word line may be different from a change and shift in distribution of the second word line.

In this case, when a read operation is performed on memory cells using each of the first to third default read levels DRL1 to DRL3, a read error may occur in some of memory cells programmed with the first to third program states P1 to P3. Here, the read error may correspond to a case in which the number of failed bits, from among read data, is more than or equal to a reference number that may be corrected using an error correction code (ECC). Thus, the read error may be referred to as an uncorrectable ECC (UECC). To remove the read error, it may be necessary to perform a read retry operation to revise a read level.

When a read error occurs during a normal read operation using a default read level DRL, the storage device 100 may revise read levels and perform a read retry operation using the revised read levels. Thus, appropriate read levels at which the read operation is successful, for example, revised read levels CRL1 to CRL3, may be obtained. The controller 110 may execute recovery code by firmware to revise the read levels. In this case, since the execution of the recovery code may take a large amount of time, the performance of the storage device 100 may be degraded.

A probability of the occurrence of a read error may be lowered during a history read operation using a history read level. However, when the history read level is managed (or stored and updated) in units of blocks, a read retry operation may be executed to obtain a history read level of each of a plurality of blocks. Also, a storage capacity of a history buffer HB required for storing the history read level of each of the plurality of blocks may be increased. However, according to at least one embodiment of the present embodiment, since the controller 110 manages the history read level in units of super blocks SB, it is only necessary to perform a read retry operation to obtain a history read level of each of a plurality of super blocks SB, and not necessary to perform the read retry operation on each of the plurality of blocks. Therefore, a recovery code execution time may be reduced, and the storage capacity of the history buffer HB required for storing the history read level may be reduced.

Figure 6B:
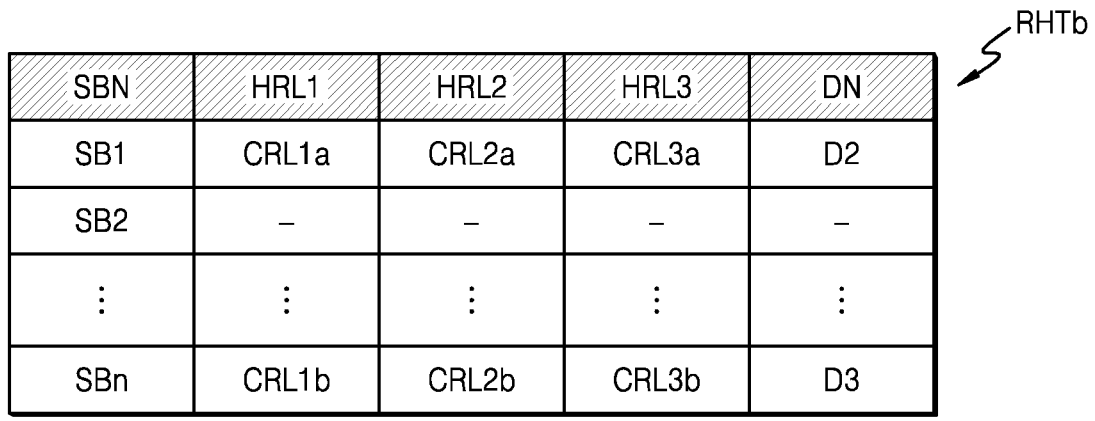
Figure 6C:
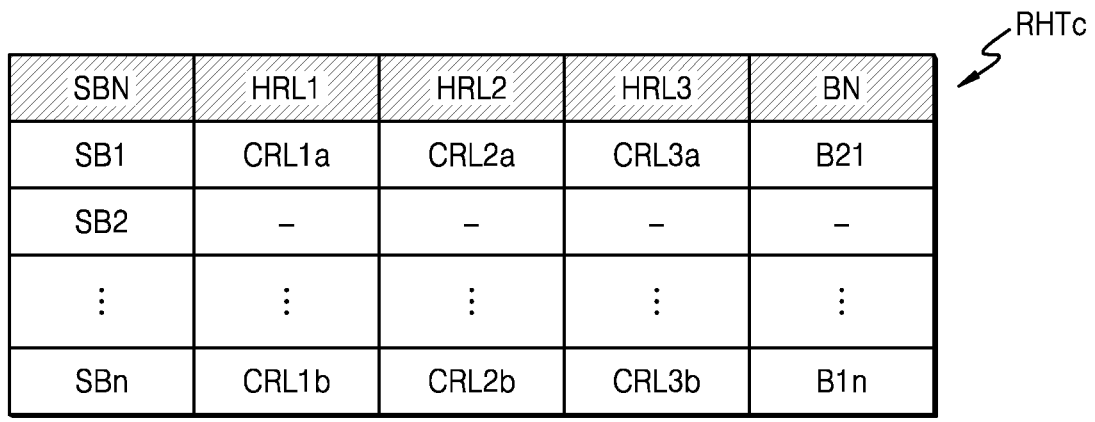

FIGS. 6A, 6B, and 6C illustrate examples of a read history table corresponding to the variation in the distribution of FIG. 5, according to exemplary embodiments of the inventive concept.

Referring to FIGS. 1 to 6A together, a read history table RHTa may be stored in the history buffer HB. The read history table RHTa stores history read levels HRL1 to HRL3 corresponding to each of a plurality of super blocks (e.g., first to n-th super blocks SB1 to SBn). For example, revised read levels CRL1a, CRL2a, and CRL3a corresponding to the first super block SB1 are stored as the history read levels HRL1 to HRL3. Also, revised read levels CRL1b, CRL2b, and CRL3b corresponding to the second super block SB2 are stored as the history read levels HRL1 to HRL3, and revised read levels CRL1c, CRL2c, and CRL3c corresponding to the n-th super block SBn are stored as the history read levels HRL1 to HRL3. The history read levels HRL1 to HRL3 corresponding to each of the first to n-th super blocks SB1 to SBn may be updated with respect to time. Hereinafter, an operation of generating the read history table RHTa will be described.

The controller 110 performs a normal read operation on one block of the first super block SB1 (e.g., a first block on which a read operation is initially performed during a runtime of the storage device 100, from among a plurality of blocks of the first super block SB1), based on the default read levels DRL1, DRL2, and DRL3. When a read error occurs, the controller 110 performs a read retry operation on the first block using the revised read levels CRL1a, CRL2a, and CRL3a. When the read error does not occur, the controller 110 may store the revised read levels CRL1a, CRL2a, and CRL3a as the history read levels HRL1 to HRL3 corresponding to the first super block SB1 in the read history table RHTa. Similarly, the controller 110 may perform a normal read operation and/or a read retry operation on the second to n-th super blocks SB2 to SBn and store the revised read levels CRL1b, CRL2b, and CRL3b in the read history table RHTa. If the read retry operation fails, the controller 110 may adjust the revised read levels CRL1a, CRL2a, and CRL3a, update the history read levels HRL1 to HRL3 associated with the first superblock SB1 in the read history table RHTa to the adjusted read levels, respectively, and re-perform the read retry operation based on the adjusted read levels. If the normal read operation was successful with the default read levels DRL1, DRL2, and DRL3, the controller 110 may update the history read levels HRL1 to HRL3 associated with the first superblock SB1 in the read history table RHT to the default read levels DRL1, DRL2, and DRL3, respectively.

In some embodiments, when memory cells are single-level cells programmed with one bit, the memory cells may have one of an erase state and a program state. In this case, a read history table may store revised read levels corresponding to each of the first to n-th super blocks SB1 to SBn as history read levels. An operation of generating the read history table may be substantially the same as that described above with reference to FIG. 6A.

Referring to FIG. 6B, as described with reference to FIG. 6A, a read history table RHTb stores history read levels HRL1 to HRL3 corresponding to each of a plurality of super blocks (e.g., first to n-th super blocks SB1 to SBn). Also, the read history table RHTb stores a device number DN indicating an address of a memory device (hereinafter, referred to as a 'device'). For example, the device number DN may indicate a device including a block on which a read operation (or a read retry operation) is performed when history read levels HRL1 to HRL3 corresponding to a super block are obtained. For example, as shown in FIG. 6B, the first superblock SB1 could be located on a first memory chip with a device number of D2 and the second superblock SB2 could be located on a second memory chip with a device number of D3. In an exemplary embodiment, the device number is stored on each memory chip of the memory 120 or the device numbers of all memory chips are stored within the memory 120, but outside the memory chips. In an exemplary embodiment, the device number can be queried by the controller 110. For example, the controller 110 can send a request for a device number of a memory chip to the memory 120 and then the memory 120 can respond to the controller 110 with the corresponding device number.

For example, in FIG. 3A, when a read retry operation is performed on the block B21 out of the blocks B11 to B81 included in the first super block SB1 and the revised read levels CRL1a, CRL2a, and CRL3a are obtained, the second device D2 including the block B21 may be stored as a device number DN. As described above with reference to FIG. 1, there may be differences in electrical characteristics between devices. Electrical characteristics of each of the first to eighth devices D1 to D8 may be detected during a manufacturing process (e.g., a device test operation) and stored in the corresponding device. For example, the detected electrical characteristics may be stored in one of a plurality of blocks included in the corresponding device or a peripheral circuit of the corresponding device.

When a history read operation is performed on blocks (e.g., B11 and B81) other than the block B21 based on the revised read levels CRL1a, CRL2a, and CRL3a, the controller 110 may ascertain which device the revised read levels CRL1a, CRL2a, and CRL3a are obtained from, that is, whether the revised read levels CRL1a, CRL2a, and CRL3a are obtained from the second device D2, adjust the revised read levels CRL1a, CRL2a, and CRL3a based on an offset in which differences in electrical characteristics between the second device D2 and a device including a block on which a history read operation is to be performed are reflected, and perform the history read operation based on the adjusted read levels. For example, the controller 110 may add the offset to each of the revised read levels CRL1a, CRL2a, and CRL3a and generate the adjusted read levels. For example, if a history read operation on block B21 of device D2 was previously performed, its corresponding entry in the read history table RHTb could be stored temporarily in a buffer of the controller 110, and then if a history read operation next needs to be performed on a block in device D3, an offset can be added to the read levels in the buffer to arrive at read levels for the block of device D3.

Referring to FIG. 6C, as described with reference to FIG. 6A, a read history table RHTc stores history read levels HRL1 to HRL3 corresponding to each of a plurality of super blocks (e.g., first to n-th super blocks SB1 to SBn) and store a block number BN corresponding to an address of a block. For example, the block number BN may indicate a block on which a read operation (or a read retry operation) is performed when the history read levels HRL1 to HRL3 of the super blocks are obtained. For instance, in FIG. 3A, when a read retry operation is performed on the block B21 out of the blocks B11 to B81 included in the first super block SB1 and the revised read levels CRL1a, CRL2a, and CRL3a are obtained, B21 may be stored as a block number BN.

For example, electrical characteristics of each of a plurality of blocks included in each of the first to eighth devices D1 to D8 may be detected during a manufacturing process (e.g., a device test operation) and stored in the corresponding device. For example, characteristics of each of a plurality of blocks of the corresponding device may be stored in the corresponding block, a specific block, or a peripheral circuit of the corresponding device.

When a history read operation is performed on blocks (e.g., B11 and B81) other than the block B21 based on the revised read levels CRL1a, CRL2a, and CRL3a, the controller 110 may ascertain which block the revised read levels CRL1a, CRL2a, and CRL3a are obtained from, that is, whether the revised read levels CRL1a, CRL2a, and CRL3a are obtained from block B21, adjust the revised read levels CRL1a, CRL2a, and CRL3a based on an offset in which differences in electrical characteristics between the block B21 and a block on which a history read operation is to be performed are reflected, and perform the history read operation based on the adjusted read levels.

Figure 7:
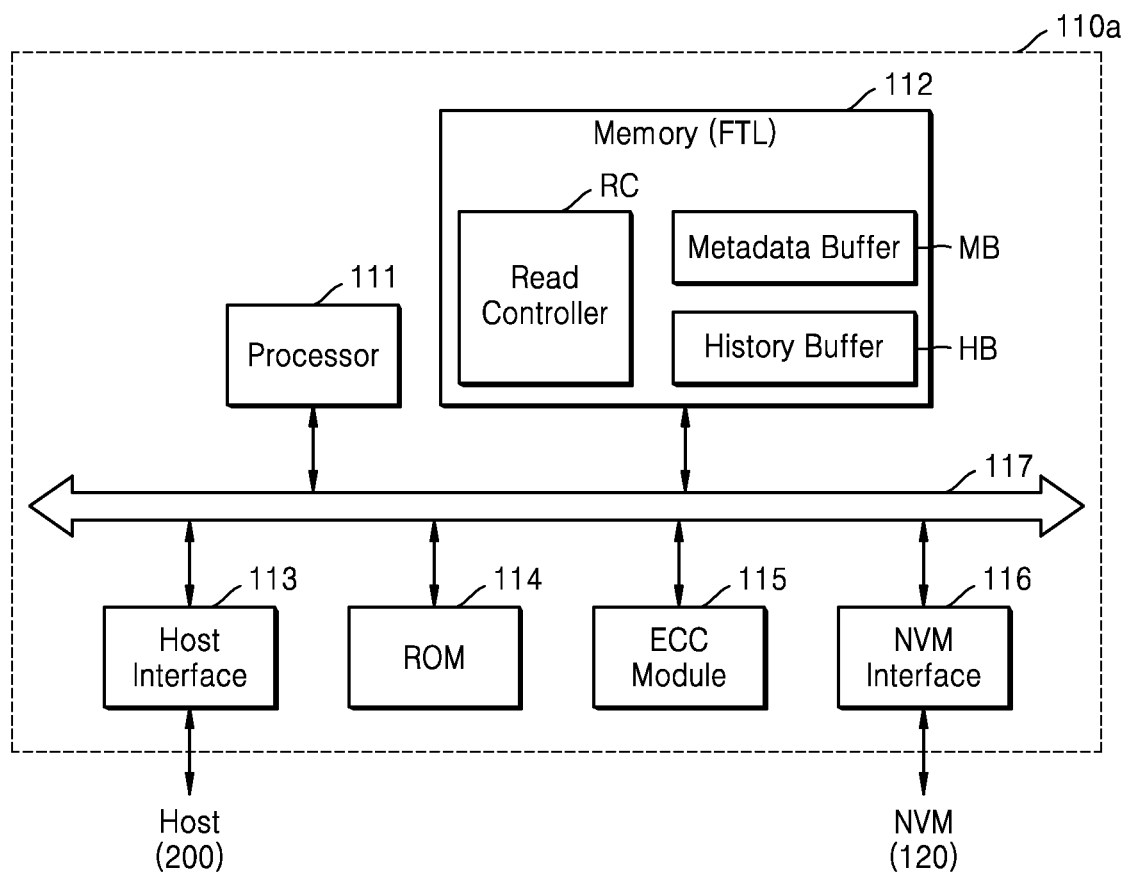
FIG. 7 is a block diagram of an example of a controller of FIG. 1, according to an exemplary embodiment of the inventive concept.

FIG. 7 is a block diagram of an example of the controller 110 of FIG. 1, according to an exemplary embodiment of the inventive concept.

Referring to FIG. 7, a controller 110a includes a processor 111, a memory 112, a host interface 113 (e.g., an interface circuit), read-only memory (ROM) 114, an ECC module 115, and an NVM interface 116 (e.g., an interface circuit), which may communicate with each other through a bus 117. The processor 111 may include a central processing unit (CPU) or a microprocessor (MP) and control the overall operation of the controller 110a. The processor 111 may include at least one processor core capable of executing an instruction set of program code configured to perform a specific operation. For example, the processor 112 may execute command code of firmware stored in the ROM 114.

The memory 112 may operate via the control of the processor 111 and be used as an operation memory, a buffer memory, and/or a cache memory. For example, the memory 112 may be implemented as a volatile memory, such as dynamic random access memory (DRAM) and static RAM (SRAM) or an NVM, such as phase-change RAM (PRAM) and a flash memory.

A read controller RC of the memory 112 may be implemented as firmware or software and loaded in the memory 112. In an embodiment, the read controller RC is implemented as a portion of a flash translation layer (FTL) and loaded in the memory 112. However, the inventive concept is not limited thereto, and the read controller RC may be implemented as hardware.

A history buffer HB of the memory 112 may store, for example, one of the read history tables RHTa, RHTb, and RHTc shown in FIGS. 6A, 6B, and 6C and be implemented as a portion of the memory 112. In an embodiment, the read controller RC and the history buffer HB are implemented in the same chip. However, the inventive concept is not limited thereto, and the read controller RC and the history buffer HB may be implemented in different chips. For example, the history buffer HB may be implemented as a portion of an additional DRAM chip.

A metadata buffer MB of the memory 112 may store, for example, the counting table CTB of FIG. 4A and/or the degradation table DTB of FIG. 4B and be implemented as part of the memory 112 or a portion of an additional DRAM chip. In addition, the metadata buffer MB may store the address mapping table (refer to AMT in FIG. 8A) including mapping information between a logical address and a physical address and the super block mapping table (refer to SMBT in FIG. 8B) including information about blocks mapped to super blocks.

Figure 8A:
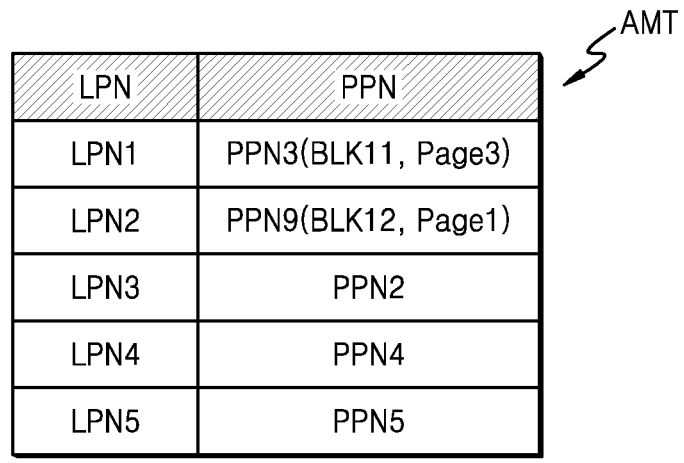
FIG. 8A illustrates an address mapping table according to an exemplary embodiment of the inventive concept.
Figure 8B:
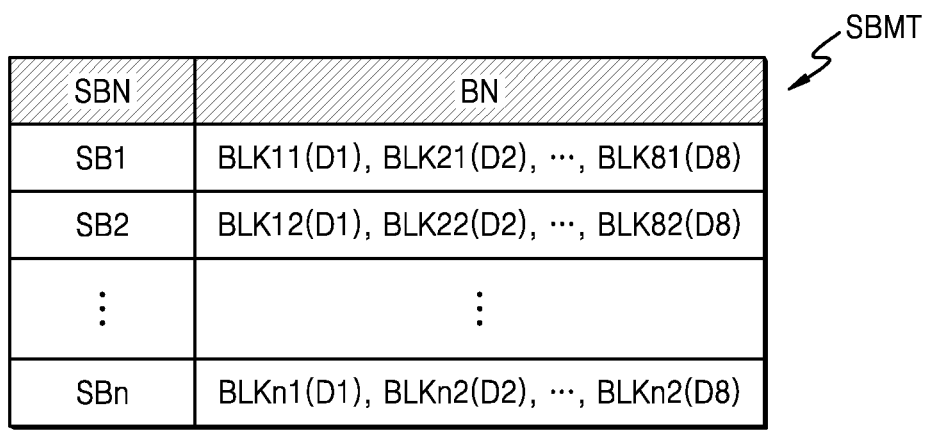
FIG. 8B illustrates a super block mapping table according to an exemplary embodiment of the inventive concept.

FIG. 8A illustrates an address mapping table AMT according to an exemplary embodiment of the inventive concept, and FIG. 8B illustrates a super block mapping table SBMT according to an exemplary embodiment of the inventive concept.

Referring to FIG. 8A, the address mapping table AMT stores a plurality of pieces of mapping data configured to convert a logical address into a physical address. The address mapping table AMT may be loaded in the metadata buffer MB of FIG. 7 and used. Each of pieces of mapping data indicate a physical page number PPN corresponding to a logical page number LPN. For example, a third physical page PPN3 corresponding to a third page of a block BLK11 may be mapped to a first logical page LPN1, and a ninth physical page PPN9 corresponding to a first page of a block BLK12 may be mapped to a second logical page LPN2.

Referring to FIG. 8B, the super block mapping table SBMT indicates block numbers BN of a plurality of blocks, which correspond to a plurality of super blocks SB1 to SBn, that is, which are grouped into each of the plurality of super blocks SB1 to SBn. For example, blocks BLK11, BLK21, . . . and BLK81 correspond to a first super block SB1. In an embodiment, as shown in FIG. 8B, the super block mapping table SBMT includes not only the block numbers BN of the blocks but also device numbers (e.g., D1, D2, . . . , and D8) including the blocks.

When the controller 110a receives a read request and a logical address from the host 200, the controller 110a may determine a physical address corresponding to the received logical address with reference to the address mapping table AMT. Thereafter, the controller 110a may refer to the super block mapping table SBMT, determine a super block corresponding to the physical address, and ascertain whether a history read level of the super block is stored in the read history table (refer to RHTa of FIG. 6A, RHTb of FIG. 6B, and RHTc of FIG. 6C).

For example, when the controller 110a receives the first logical page LPN1 from the host 200, the controller 110a determines the third physical page PPN3 corresponds to the first logical page LPN1 with reference to the address mapping table AMT. Thereafter, the controller 110a may refer to the super block mapping table SBMT, determine that the third physical page PPN3 corresponds to the first super block SB1, and ascertain whether history read levels corresponding to the first super block SB1 are stored in the history buffer (refer to HB in FIGS. 1 and 7), namely, if the history read levels corresponding to the first super block SB1 are stored in the read history table (refer to RHTa of FIG. 6A, RHTb of FIG. 6B, and RHTc of FIG. 6C). Since the history read levels (e.g., the revised read levels CRL1a, CRL2a, and CRL3a of FIG. 6A) corresponding to the first super block SBL1 are stored in the history buffer HB, a history read operation may be performed on the third physical page PPN3 based on the stored history read levels.

For example, when the controller 110a receives the second logical page LPN2 from the host 200, the controller 110a may refer to the address mapping table AMT and determine the ninth physical page PPN9 corresponds to the second logical page LPN2. Thereafter, the controller 110a may refer to the super block mapping table SBMT to determine that the ninth physical page PPN9 corresponds to the second super block SB2, and ascertain whether history read levels corresponding to the second super block SB2 are stored in the history buffer (refer to HB in FIGS. 1 and 7), namely, whether the history read levels corresponding to the second super block SB2 are stored in the read history table (refer to RHTa of FIG. 6A, RHTb of FIG. 6B, and RHTc of FIG. 6C). Since the history read levels corresponding to the second super block SBL2 are not stored in the read history table (refer to RHTa of FIG. 6A, RHTb of FIG. 6B, and RHTc of FIG. 6C), a read operation (e.g., a normal read operation) may be performed on the ninth physical page PPN9 using default read levels. When the normal read operation is successful, the default read levels may be stored as the history read levels corresponding to the second super block SB2. When the normal read operation fails, a read retry operation may be performed, and a revised read level obtained when the read operation is successful may be stored as a history read level of the second super block SB2.

Referring to FIG. 7, the host interface 113 may provide an interface between the host 200 and the controller 110a. For example, the host interface 113 may provide an interface that is based on a universal serial bus (USB), a multimedia card (MMC), peripheral component interconnect-express (PCI-E), advanced technology attachment (ATA), serial ATA (SATA), parallel-ATA (PATA), a small computer system interface (SCSI), a serial attached SCSI (SAS), an enhanced small device interface (ESDI), and an intelligent drive electronics (IDE).

The ROM 114 may store various pieces of information required for operations of the controller 110a. As an example, the ROM 114 may store an algorithm for operating the controller 110a or an algorithm for operating the read controller RC by using firmware. For example, the algorithm for operating the controller 110a may be an algorithm for managing the metadata buffer MB and an algorithm for managing the history buffer HB.

The ECC module 115 may perform an ECC operation on data (e.g., a codeword) received from the NVM 120, detect error bits from the data, and correct the detected error bits. In an embodiment, the ECC module 115 is implemented as hardware. In an embodiment, the ECC module 115 is implemented as software or firmware and loaded in the memory 112.

The NVM interface 116 may provide an interface between the controller 110a and the NVM 120. For example, metadata, write data, and read data may be transmitted and received between the controller 110a and the NVM 120 through the NVM interface 116.

Figure 9A:
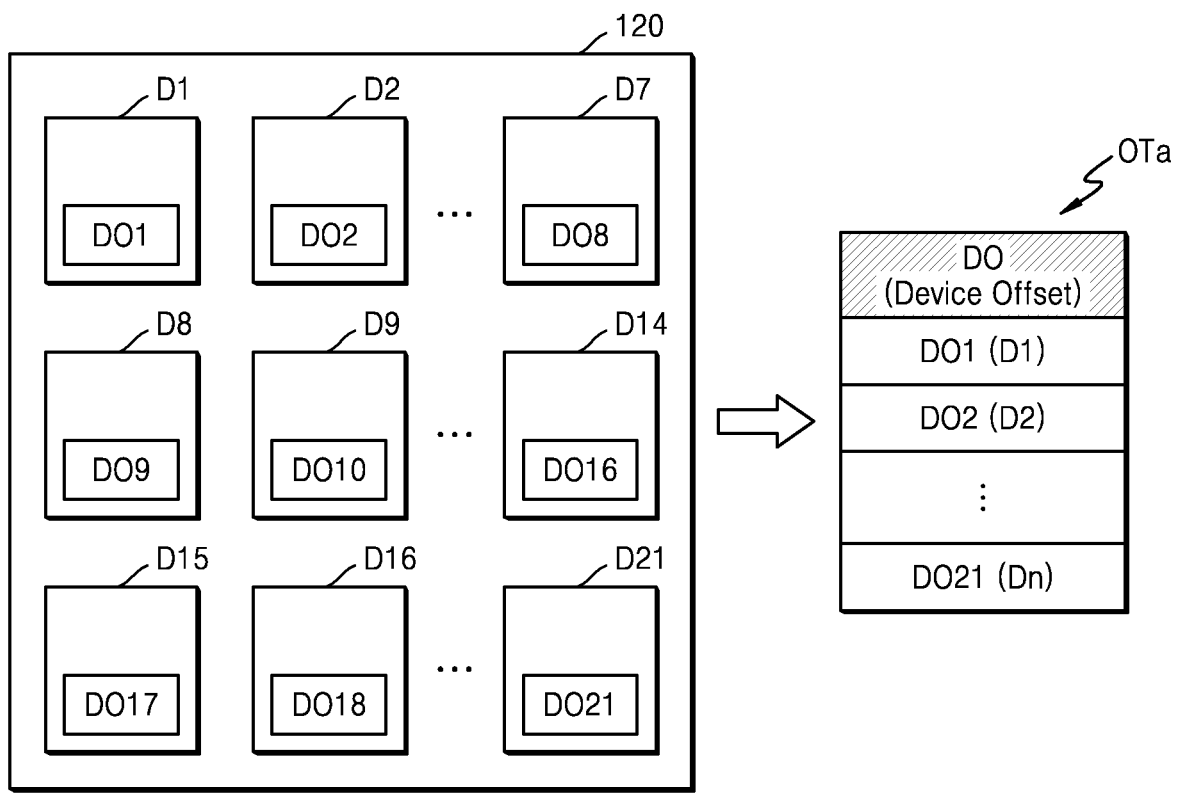
FIG. 9A illustrates a device offset of a non-volatile memory according to an exemplary embodiment of the inventive concept.
Figure 9B:
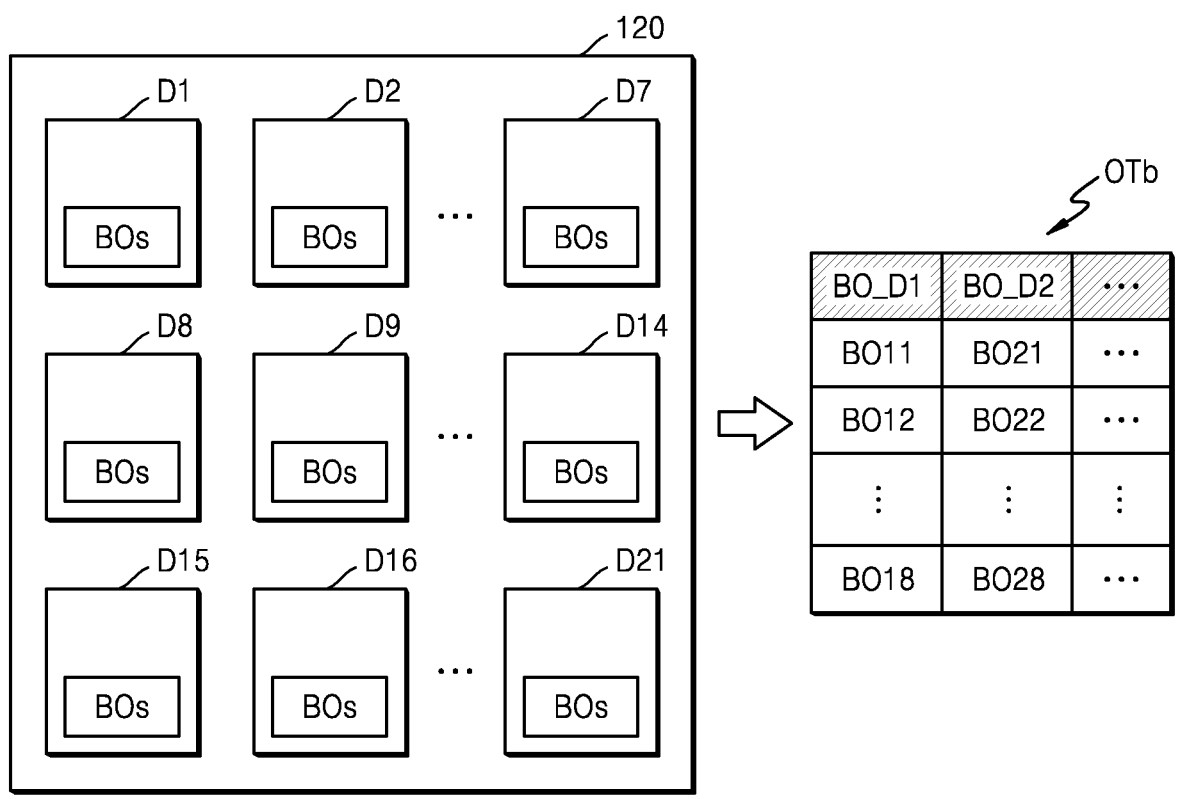
FIG. 9B illustrates a block offset according to an exemplary embodiment of the inventive concept.

FIG. 9A illustrates device offsets of an NVM 120 according to an exemplary embodiment of the inventive concept, and FIG. 9B illustrates block offsets according to an exemplary embodiment of the inventive concept.

Referring to FIGS. 1 and 9A, a plurality of devices (e.g., first to twenty-first devices D1 to D21) of the NVM 120 store corresponding device offsets DO (e.g., first to twenty-first device offsets DO1 to DO21). Each of the device offsets DO may be calculated based on a difference in electrical characteristics between the plurality of devices and stored in the device corresponding thereto during an operation of manufacturing the storage device 100. When the storage device 100 is powered on, the controller 110 may read the first to twenty-first device offsets DO1 to DO21 from the first to twenty-first devices D1 to D21, configure and store the first to twenty-first device offsets DO1 to DO21 as an offset table OTa, and refer to the offset table OTa. For example, the offset table OTa may be stored in a metadata buffer MB.

Referring to FIG. 9B, each of the plurality of devices (e.g., first to twenty-first devices D1 to D21) of the NVM 120 may store offsets (i.e., block offsets BOs) of blocks included in a device corresponding thereto. During the operation of manufacturing the storage device 100, each of the block offsets BOs may be calculated based on a difference in electrical characteristics between a plurality of blocks of the plurality of devices and stored in a device corresponding thereto. For example, when the first device D1 includes first to eighth blocks, first to eighth block offsets BO11 to BLO18 corresponding to the first to eighth blocks may be stored in the first device D1. When the storage device 100 is powered on, the controller 110 may read the block offsets BOs from the first to twenty-first devices D1 to D21, configure and store the block offsets BOs as an offset table OTb, and refer to the offset table OTb. For example, the offset table OTb may be stored in the metadata buffer MB. The offset table OTb including the block offsets BOs may store the block offsets BOs in units of devices. For example, block offsets BO11 to BO18 corresponding to the first to eighth blocks of the first device D1 may be stored in a block offset BO_D1 entry of the first device D1, and block offset BO21 to BO28 corresponding to blocks of the second device D2 may be stored in a block offset BO_D2 entry of a second device D2.

The device offsets DO or the block offsets BOs, which have been described with reference to FIGS. 9A and 9B, may be used during a history read operation. As described with reference to FIG. 1, to compensate for differences in characteristics between the plurality of blocks BLK included in the same super block SB or differences in characteristics between the plurality of memory devices included in each of the plurality of blocks BLK, the controller 110 may add the device offset DO or the block offset BO to a history read level, calculate an adjusted read level, and perform the history read operation based on the adjusted read level.

Figure 10:
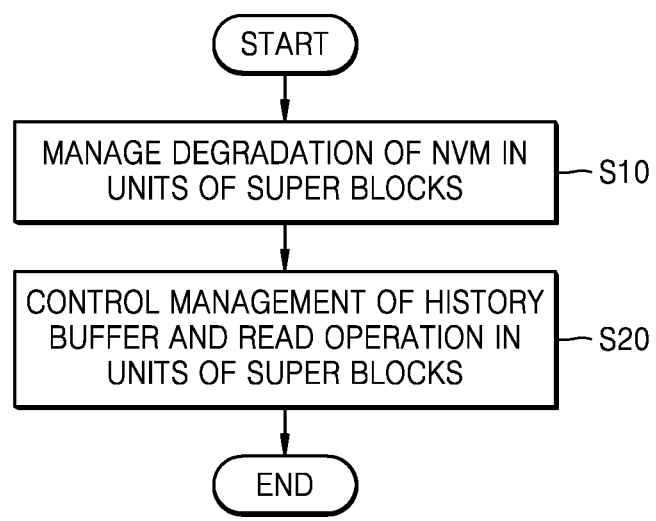
FIG. 10 is a schematic flowchart of a method of operating a storage device according to an exemplary embodiment of the inventive concept.
Figure 11:
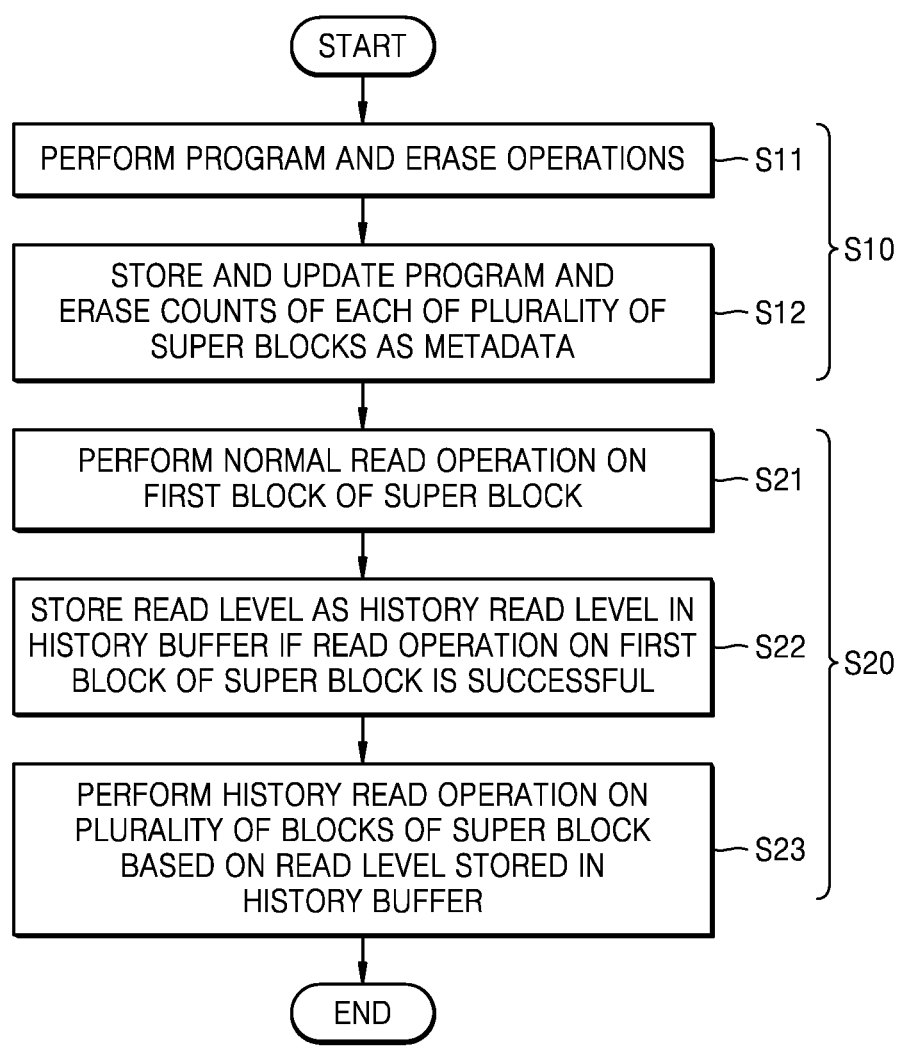
FIG. 11 is a detailed flowchart of the operating method shown in FIG. 10 according to an exemplary embodiment of the inventive concept.

FIG. 10 is a schematic flowchart of a method of operating a storage device 100 according to an exemplary embodiment of the inventive concept, and FIG. 11 is a detailed flowchart of the operating method shown in FIG. 10. The operating method shown in FIGS. 10 and 11 may be performed in a temporal sequence by the storage device 100 of FIG. 1. The descriptions provided with reference to FIGS. 1 to 9B may also be applied to the present embodiment.

Referring to FIGS. 1 and 10, the storage device 100 manages the degradation of the NVM 120 in units of super blocks (S10). Also, the storage device 100 controls the management of the history buffer HB and a read operation on the NVM 120 in the units of super blocks (S20). A super block may include a plurality of memories or memory blocks. For example, the controller 110 may group at least one block included in each of a plurality of memory devices included in the NVM 120 into super blocks or group a plurality of blocks having similar electrical characteristics into super blocks in the NVM 120 and control the management of the degradation of the NVM 120, the management of the history buffer HB, and the read operation in units of super blocks. Operations S10 and S20 may be continuously performed during a runtime of the storage device 100.

Referring to FIG. 11, the storage device 100 performs program and erase operations (S11), stores and updates program and erase counts of each of a plurality of super blocks (S12). For example, the controller 110 may store the counting table (refer to CTB in FIG. 4A) including program and erase counts corresponding to each of the plurality of super blocks in the metadata buffer MB. As program and erase operations are continuously performed, the program and erase counts may be updated in units of super blocks. As described above, the storage device 100 may manage the deterioration of the NVM 120 in units of super blocks.

The storage device 100 performs a normal read operation on a first block of the super block (S21). For example, the first block may be a block on which a read operation is initially performed, from among a plurality of blocks of the super block, after the storage device 100 is powered on. The storage device 100 may perform the normal read operation on the first block based on a default read level. When the read operation performed based on the default read level fails, the storage device 100 performs a read retry operation based on a revised read level.

When the read operation on the first block of the super block is successful, the storage device 100 stores a read level as a history read level in the history buffer HB (S22). For example, when the read operation performed based on the default read level is successful, the controller 110 may store the default read level as a history read level of the super block in the history buffer HB. Alternatively, when the read retry operation performed on the revised read level is successful, the controller 110 may store the revised read level as the history read level of the super block in the history buffer HB.

The storage device 100 performs a history read operation on the plurality of blocks of the super block based on the history read level stored in the history buffer HB (S23). In operation S22, after the history read level of the super block is stored in the history buffer HB, the history read operation may be performed on the super block. For instance, when the controller 110 performs a read operation (hereinafter, referred to as a "host read operation") on the first block in response to a read request from the host 200 or performs the host read operation on other blocks of the super block, the host read operation may be performed based on the history read level. Alternatively, even when the controller 110 performs a background read operation for updating the history read level, the history read operation may be performed based on the history read level.

As described above, since the storage device 100 according to an exemplary embodiment manages program and erase counts of the NVM 120 in units of super blocks, the storage device 100 may manage the degradation of the NVM 120, manage the history read level stored in the history buffer HB in the units of super blocks, and control the read operation. In the storage device 100 according to at least one exemplary embodiment, endurance and retention characteristics of the plurality of blocks included in the super block may be similarly changed due to program and erase operations. Accordingly, the history read level may be stored and updated in the history buffer HB in the units of super blocks, and thus, a recovery code execution time may be minimized, the performance of the storage device 100 may be improved, and a capacity of the history buffer HB may be reduced.

Figure 12:
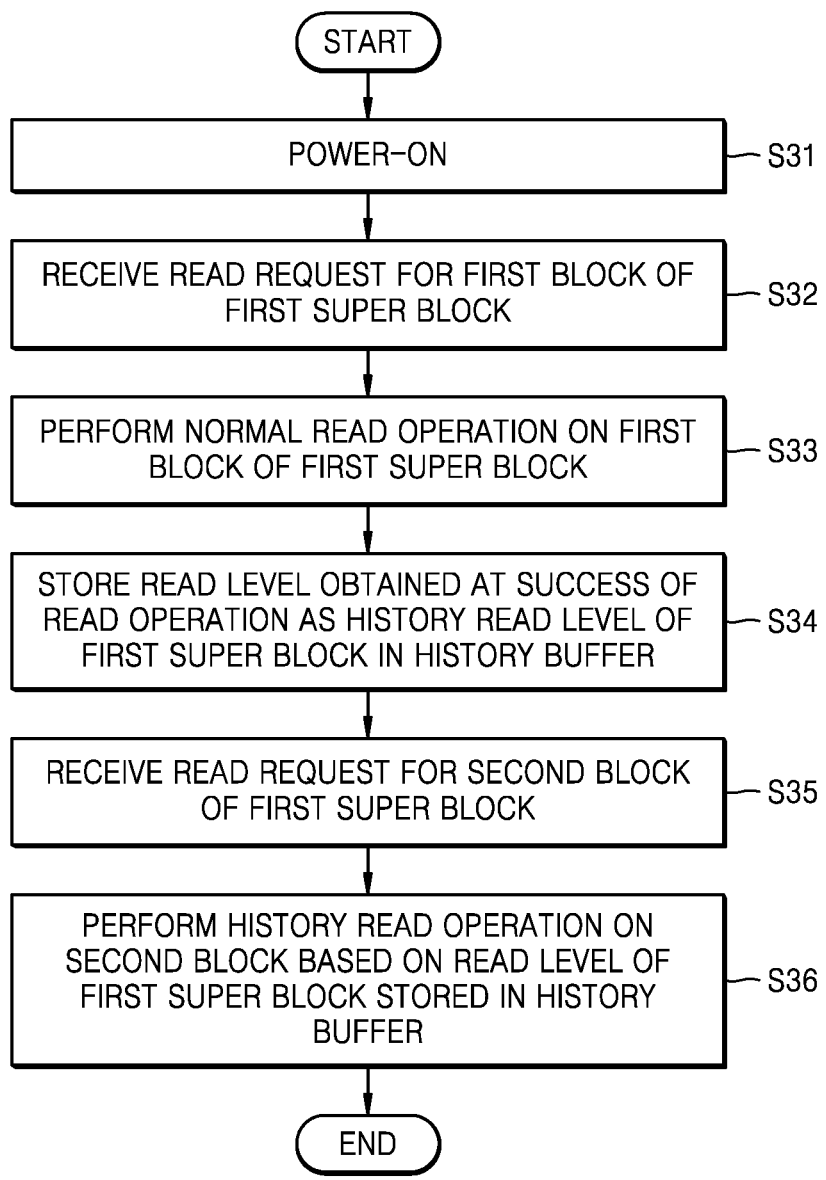
FIG. 12 is a flowchart of a method of operating a storage device according to an exemplary embodiment of the inventive concept.

FIG. 12 is a flowchart of a method of operating a storage device 100 according to an exemplary embodiment of the inventive concept. FIG. 12 illustrates an example of operation S20 of FIG. 10.

Referring to FIGS. 1 and 12, the storage device 100 is powered on (S31). After the storage device 100 is powered on, when the NVM 120 performs a read operation, a history read level may be stored in the history buffer HB and updated.

The storage device 100 receives a read request for a first block of a first super block from the host 200 (S32). For example, a logical address (e.g., a logical page), which is received along with a read command from the host 200, may indicate a physical address (e.g., a physical page) corresponding to the first block of the first super block.

The storage device 100 performs a normal read operation on the first block of the first super block (S33). The storage device 100 may perform the normal read operation based on a default read level set for the first super block. When the read operation fails, the storage device 100 may perform a read retry operation based on a revised read level obtained due to the execution of recovery code.

When the read operation on the first block of the first super block is successful, the storage device 100 stores a read level as a history read level of the first super block in the history buffer HB (S34). The default read level or the revised read level may be stored as the history read level. For example, the read level that resulted in a successful read operation is stored as the history read level.

Thereafter, the storage device 100 receives a read request for a second block of the first super block from the host 200 (S35). The storage device 100 performs a history read operation on the second block based on the history read level of the first super block stored in the history buffer HB (S36). Although a history read level of the second block has not been obtained, since a history read level is managed in units of super blocks and a history read level of a super block is usable during a read operation on a plurality of blocks included in the super block, it is unnecessary to perform a read retry operation to obtain the history read level of the second block. Thus, a recovery code execution time may be reduced.

In an embodiment, when the history read operation on the second block fails, the storage device 100 performs a read retry operation on the second block based on the revised read level. When a read operation is successful due to the read retry operation, the revised read level may be stored as the history read level of the first super block in the history buffer HB, and thus, the history read level may be updated.

Moreover, although an example has been described in which the storage device 100 performs a normal read operation on the first block in response to the read request received from the host 200 in operations S32 and S33, the inventive concept is not limited thereto. In another embodiment, the storage device 100 performs a background read operation (or a patrol read operation) without receiving the read request from the host 200. When the background read operation on the first block is successful, that is, when a normal read operation performed based on a default read level or a read retry operation performed based on a revised read level is successful, the storage device 100 may store the read level that resulted in the success as the history read level of the first super block in the history buffer HB.

For example, when the storage device 100 is powered on, the storage device 100 may perform a background read operation on a plurality of blocks of the NVM 120, and store a read level, which is obtained when the read operation on the first block of the first super block is successful, as the history read level of the first super block in the history buffer HB. In another example, when the storage device 100 is powered on, the storage device 100 may perform a background read operation on selected blocks of each of a plurality of super blocks, from among the plurality of blocks of the NVM 120. For example, the controller 110 may perform a background read operation on the first block, from among the blocks included in the first super block. When the read operation on the first block is successful, the storage device 100 may store the read level that resulted in the success as the history read level of the first super block in the history buffer HB.

Figure 13:
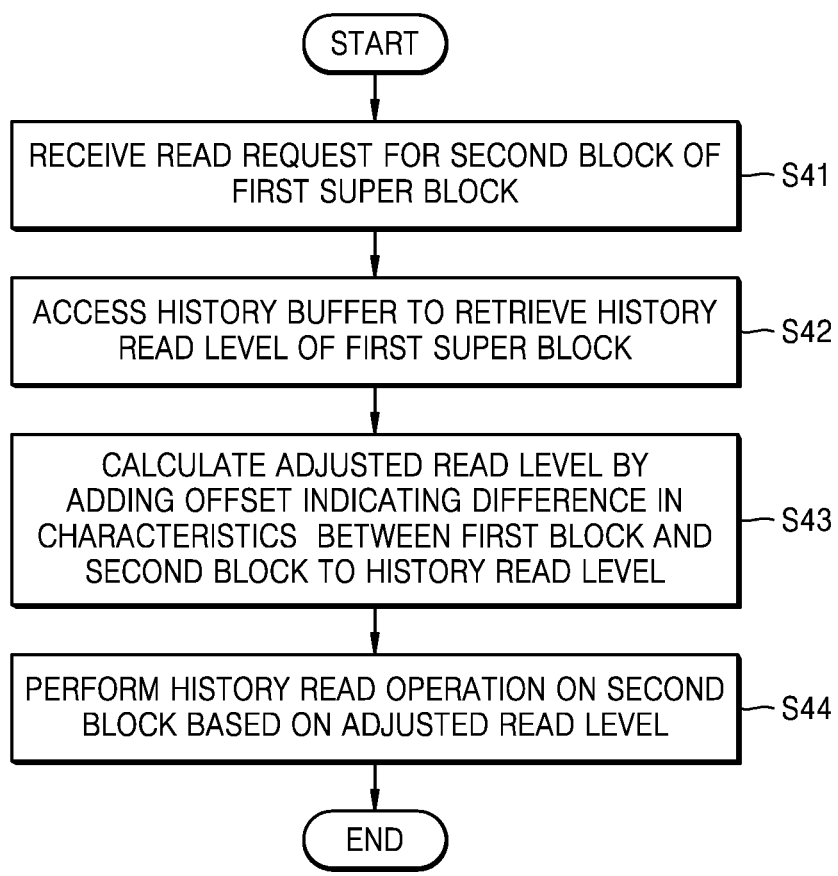
FIG. 13 is a flowchart of a method of operating a storage device according to an exemplary embodiment of the inventive concept.

FIG. 13 is a flowchart of a method of operating a storage device 100 according to an exemplary embodiment of the inventive concept. FIG. 13 is a detailed flowchart of the history read operation (S36) of FIG. 12, and the history read operation (S36) may be performed in a temporal sequence by the storage device 100 of FIG. 1.

Referring to FIGS. 1 and 13, the storage device 100 receives a read request for a second block of a first super block from the host 200 (S41). The storage device 100 accesses the history buffer HB to retrieve a history read level of the first super block (S42). For example, the history read level may be the read level stored in operation S34 of FIG. 12 when the read operation on the first block is successful.

The storage device 100 adds an offset indicating a characteristic difference between the first block and the second block to the history read level and calculates an adjusted read level (S43). For example, when the first block and the second block are included in a first device and a second device, respectively, the controller 110 may refer to the offset table (refer to OTa in FIG. 9A) including the device offsets, add a difference between the first device offset DO1 and the second device offset DO2 as the offset to the history read level, and calculate the adjusted read level. Alternatively, the controller 110 may refer to the offset table (refer to OTb in FIG. 9B) including the block offsets, add a difference between the offset of the first block and the offset of the second block as the offset to the history read level, and calculate the adjusted read level.

The storage device 100 performs a history read operation on the second block based on the adjusted read level (S44).

FIGS. 14A and 14B illustrate operations of a controller 110 and an NVM 120 of a storage device, according to example embodiments.

Referring to FIG. 14A, the controller 110 issues a read command (S111), and transmits the read command to the NVM 120 (S112). The controller 110 may issue the read command in response to a read request from the host (refer to 200 in FIG. 1). Alternatively, the controller 110 may perform a background read operation and issue the read command by itself. The controller 110 may transmit an address of a physical region (e.g., a physical page), in which a read operation is to be performed, and a default read level as a control signal to the NVM 120 along with the read command.

The NVM 120 performs a normal read operation based on the default read level (S121). The NVM 120 transmits read data to the controller 110 (S122). For example, data retrieved from the NVM 120 during the normal read operation corresponds to the read data.

The controller 110 determines whether the normal read operation has failed (S113). Specifically, the ECC module (refer to 115 in FIG. 7) may perform an ECC operation on received data, and determine whether the number of failed bits (e.g., a number of bit errors) detected in the received data exceeds the error correction capability of the ECC module 115. If it is determined that the number of failed bits does not exceed the error correction capability or that the received data includes no failed bit, it is determined that the normal read operation is successful, and the controller 110 stores a read level (e.g., the default read level) as a history read level in a history buffer HB (S118).

Otherwise, if the number of failed bits exceeds the error correction capability, it is determined that the normal read operation has failed, and the controller 110 executes recovery code (S114). The controller 110 issues a read retry command due to the execution of the recovery code (S115). Also, the controller 110 may issue an address of a physical region on which a read operation has failed, and determine a read retry voltage as a revised read level. The controller 110 transmits the read retry command to the NVM 120 (S116). The controller 110 may transmit an address to the NVM 120 along with the read retry command, and transmit the read retry voltage (i.e., the revised read level) as a control signal.

The NVM 120 performs a read retry operation based on the revised read level (S123), and transmits data, which is read due to the read retry operation, to the controller 110 (S124).

The controller 110 determines whether a read operation due to the read retry operation has failed (S117). As described above in operation S113, the ECC module 115 may perform the ECC operation on the received data and determine whether the read operation has failed, based on the result. When the read operation has failed, the controller 110 may perform the operation S114 again. When the read operation is successful, the controller 110 stores the read level (i.e., the revised read level) as the history read level in the history buffer HB (S118). Thus, a history read level of a super block may be stored in the history buffer HB.

FIG. 14B illustrates operations of the controller 110 and the NVM 120 due to a history read operation after the operations of FIG. 14A.

Referring to FIG. 14B, the controller 110 receives a read request from a host 200 (S211). The controller 110 may receive a read request and an address from the host 200.

The controller 110 retrieves a history read level from the history buffer HB (S212). The controller 110 may read the history read level of a super block including a physical page corresponding to the address (i.e., a logical page) from the history buffer HB.

The controller 110 transmits a read command to the NVM 120 (S213). The controller 110 may transmit the history read level as a control signal along with the read command to the NVM 120.

The NVM 120 performs a history read operation based on the history read level (S221). For example, the NVM 120 performs a read operation on a block of the super block using the history read level to retrieve read data. The NVM 120 transmits the read data that is due to performing the history read operation to the controller 110 (S222).

Subsequently, the controller 110 performs an ECC operation on the received data to determine whether the read operation has failed (S214). If the read operation is successful, the controller 110 transmits the data to the host 200 (S220).

If the read operation has failed, the controller 110 executes recovery code and performs a read retry operation. For example, the execution of the recover code may adjust the read level and the read retry operation may compare voltages representing the read data to the adjusted read level. Subsequent operations S215 to S218 performed by the controller 110 may be the same as operations S114 to S117 of FIG. 14A, and operations S223 and S224 performed by the NVM 120 may be the same as operations S123 and S124 of FIG. 14A. Thus, repeated descriptions will be omitted.

Moreover, when a read operation is successful in operation S218, the controller 110 updates a history read level of the history buffer HB (S219). The controller 110 may update the history read level based on a revised read level that is determined due to the execution of the recovery code in operation S215. Also, the controller 110 transmits data to the host 200 (S220).

Figure 15:
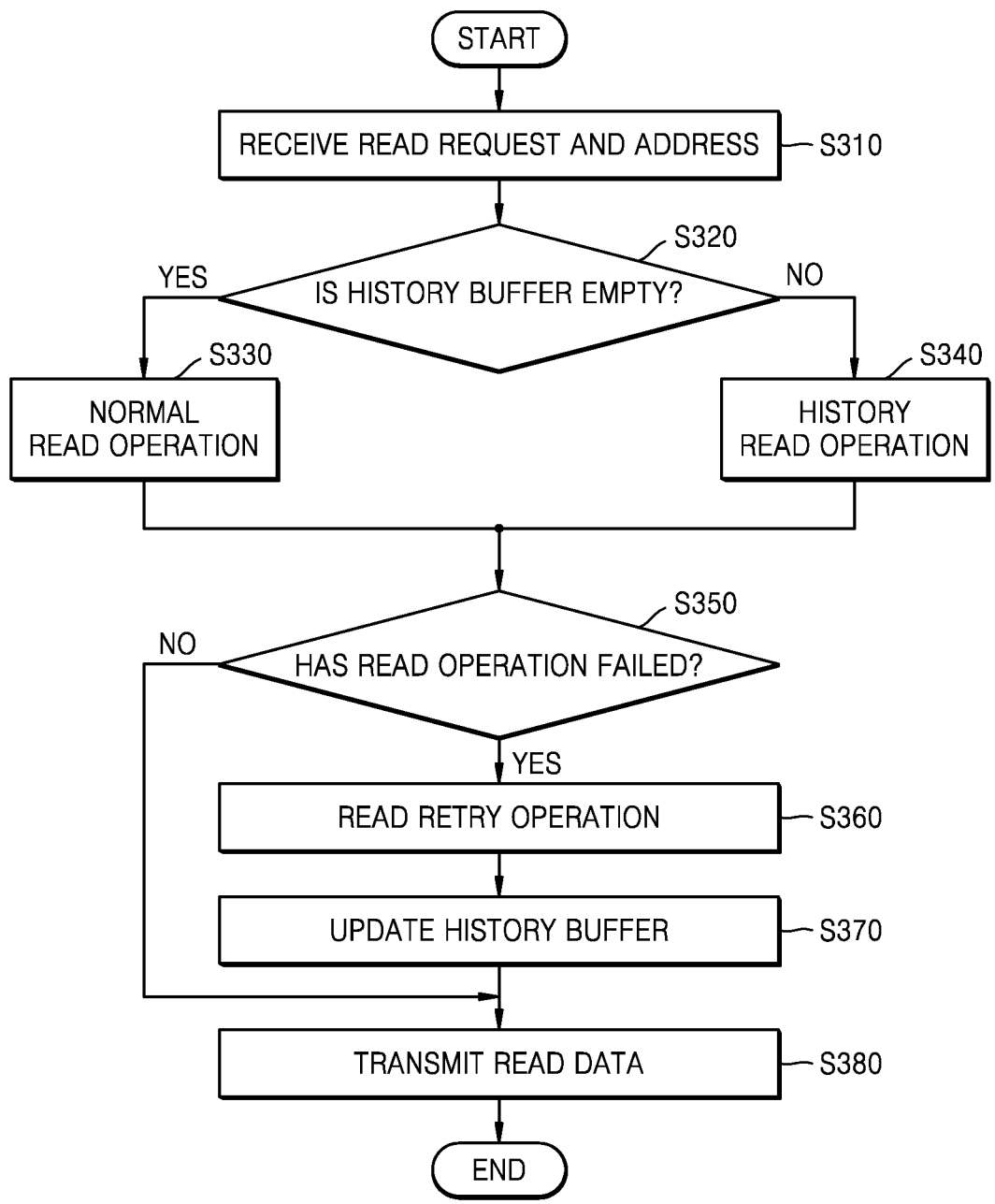
FIG. 15 is a flowchart of a method of operating a storage device according to an exemplary embodiment of the inventive concept.

FIG. 15 is a flowchart of a method of operating a storage device 100 according to an exemplary embodiment of the inventive concept. FIG. 15 illustrates a host read operation performed when a read request is received from a host. The operating method of FIG. 15 may be performed by the storage device 100 of FIG. 1. Thus, the operating method of FIG. 15 will be described with reference to FIG. 1.

The storage device 100 receives a read request and an address from the host 200 (S310). The address may include an address (i.e., a logical address) of a logical region, and the storage device 100 may determine a physical region (e.g., a physical page) corresponding to the logical region, and determine a block and a super block, which include the physical region. For example, the super block includes the determined block.

The storage device 100 determines whether the history buffer HB is empty (S320). Here, it will be understood that when the history buffer HB is referred to as being "empty," a history read level of a super block corresponding to a block to be read is not stored in the history buffer HB. For example, when a history read level of a super block other than the super block corresponding to the block to be read is stored in the history buffer HB, it may be determined that the history buffer HB is empty.

When the history buffer HB is empty, in other words, when a history read level of a super block corresponding to a physical region to be read is not present in the history buffer HB, the storage device 100 performs a normal read operation based on a default read level (S330). Conversely, when the history buffer HB is not empty, in other words, when the history read level of the super block corresponding to the physical to be read is present in the history buffer HB, the storage device 100 performs a history read operation based on the history read level (S340).

After the normal read operation or the history read operation is performed, the storage device 100 determines whether the read operation has failed (S350). If the read operation has failed, the storage device 100 performs a read retry operation (S360). The storage device 100 updates the history read level of the history buffer HB based on a revised read level that is obtained when the read retry operation is successful (S370). The storage device 100 may transmit read data to the host 200 (S380).

Moreover, in FIG. 15, the history buffer HB may be updated in operation S370 due to a host read operation. However, the inventive concept is not limited thereto, and the history buffer HB may be updated due to a background read operation of the storage device 100 as will be described below with reference to FIG. 16.

Figure 16:
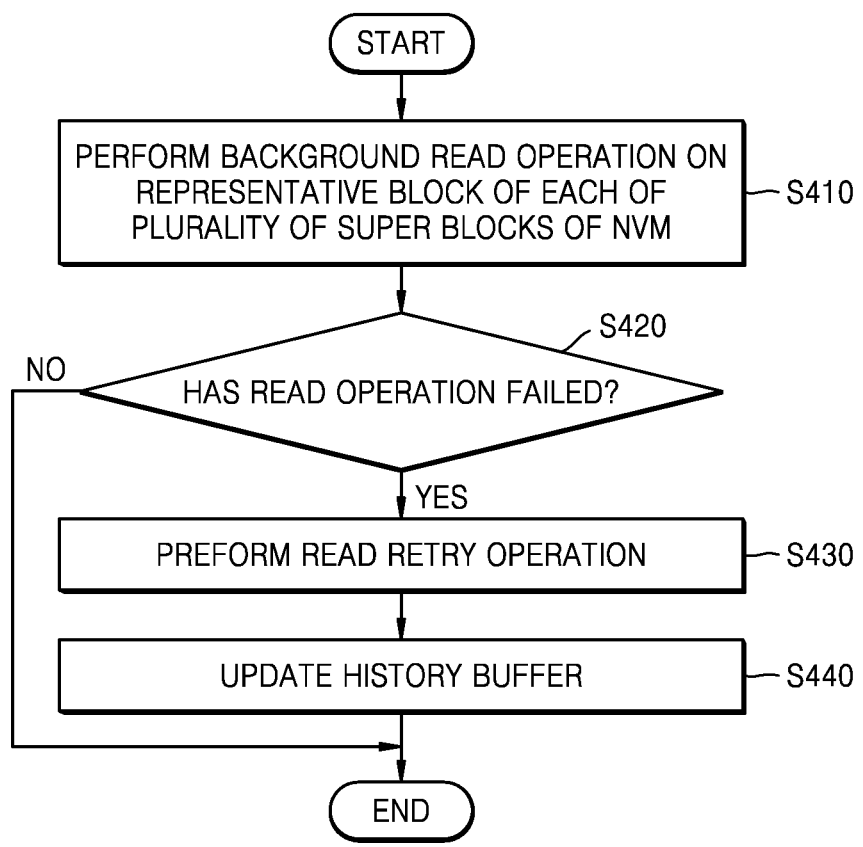
FIG. 16 is a flowchart of a method of updating a history buffer of a storage device, according to an exemplary embodiment of the inventive concept.

FIG. 16 is a flowchart of a method of updating a history buffer HB of a storage device 100, according to an exemplary embodiment of the inventive concept. The updating method of FIG. 16 may be performed in a temporal sequence by the storage device 100 of FIG. 1.

Referring to FIGS. 1 and 16, the storage device 100 performs a background read operation on a representative block of each of a plurality super blocks of the NVM 120 (S410). The storage device 100 may previously set one block of each of the plurality of super blocks as the representative block, and sequentially perform the background read operation on representative blocks. The storage device 100 may periodically or aperiodically perform the background read operation. For example, when a predetermined time elapses after a read operation is performed on a super block, the background read operation S410 may be performed based on a history read level that is previously stored in the history buffer HB. For example, the background read operation may be performed to ensure that each superblock has an up to date read level stored in the history buffer HB.

The storage device 100 determines whether the read operation has failed (S420). If the read operation has failed, the storage device 100 performs a read retry operation (S430). The read retry operation may including revising the read level applied to the representative block and comparing voltages representing data of the representative block with the revised read level to determine a codeword. If the read retry operation is successful, the storage device 100 updates the history buffer HB based on a revised read level (S440). For example, the read retry operation may be successfully when an ECC operation performed on the codeword is successful. The storage device 100 may store the revised read level in the history buffer HB as a history read level of the super block corresponding to the representative block on which the background read operation S410 is performed. Otherwise, if it is determined that the read operation is successful in operation S420, the storage device 100 may end the background read operation without updating the history buffer HB.

Figure 17:
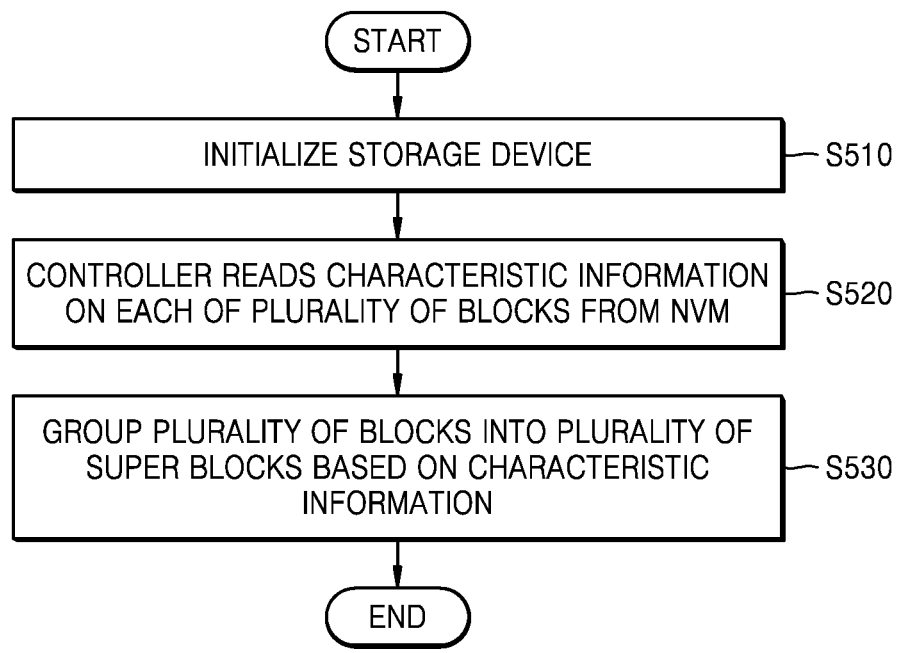
FIG. 17 is a flowchart of a method of grouping super blocks of a storage device, according to an exemplary embodiment of the inventive concept.

FIG. 17 is a flowchart of a method of grouping super blocks of a storage device 100, according to an exemplary embodiment of the inventive concept.

Referring to FIGS. 1 and 17, the storage device 100 is initialized (S510). For example, the storage device 100 may be initialized during use or after a manufacturing operation. For example, initializing the storage device 100 may include setting characteristic information in the storage device.

The controller 110 of the storage device 100 reads the characteristic information about each of a plurality of blocks from the NVM 120 (S520). During the manufacturing operation or subsequent test operations, characteristics of each of the plurality of blocks may be detected, and the characteristic information may be stored in devices. The controller 110 may read the characteristic information on blocks from a plurality of devices corresponding thereto.

The controller 110 groups the plurality blocks into a plurality of super blocks based on the characteristic information (S530). In an exemplary embodiment, the controller 110 groups blocks having similar characteristics into one super block. Afterwards, as described above, the controller 110 may manage metadata and a history buffer in units of super blocks.

Figure 18:
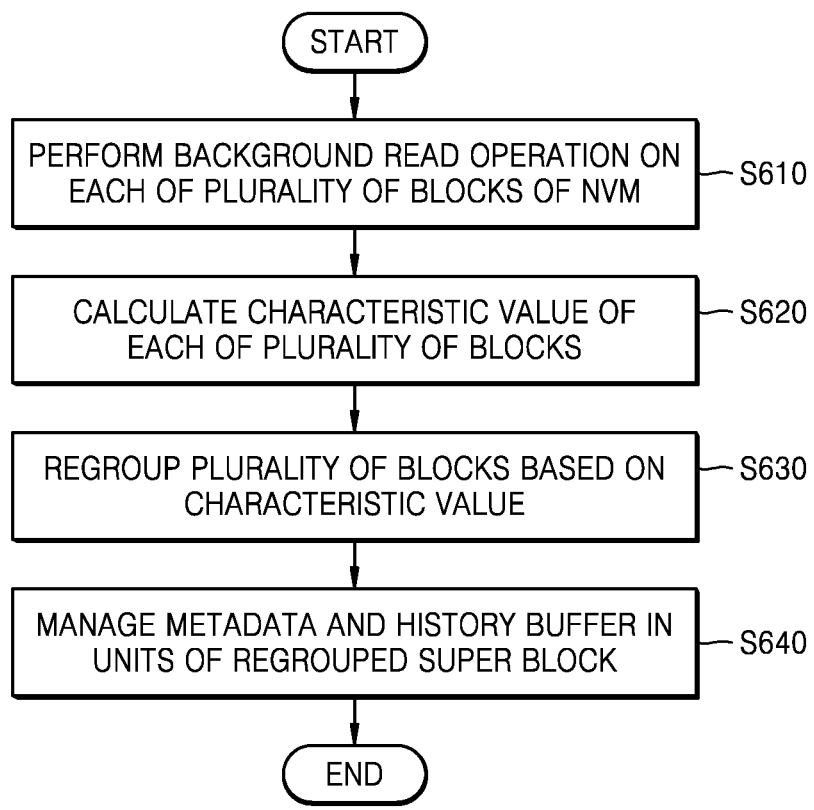
FIG. 18 is a flowchart of a method of regrouping super blocks of a storage device, according to an exemplary embodiment of the inventive concept.
Figure 19A:
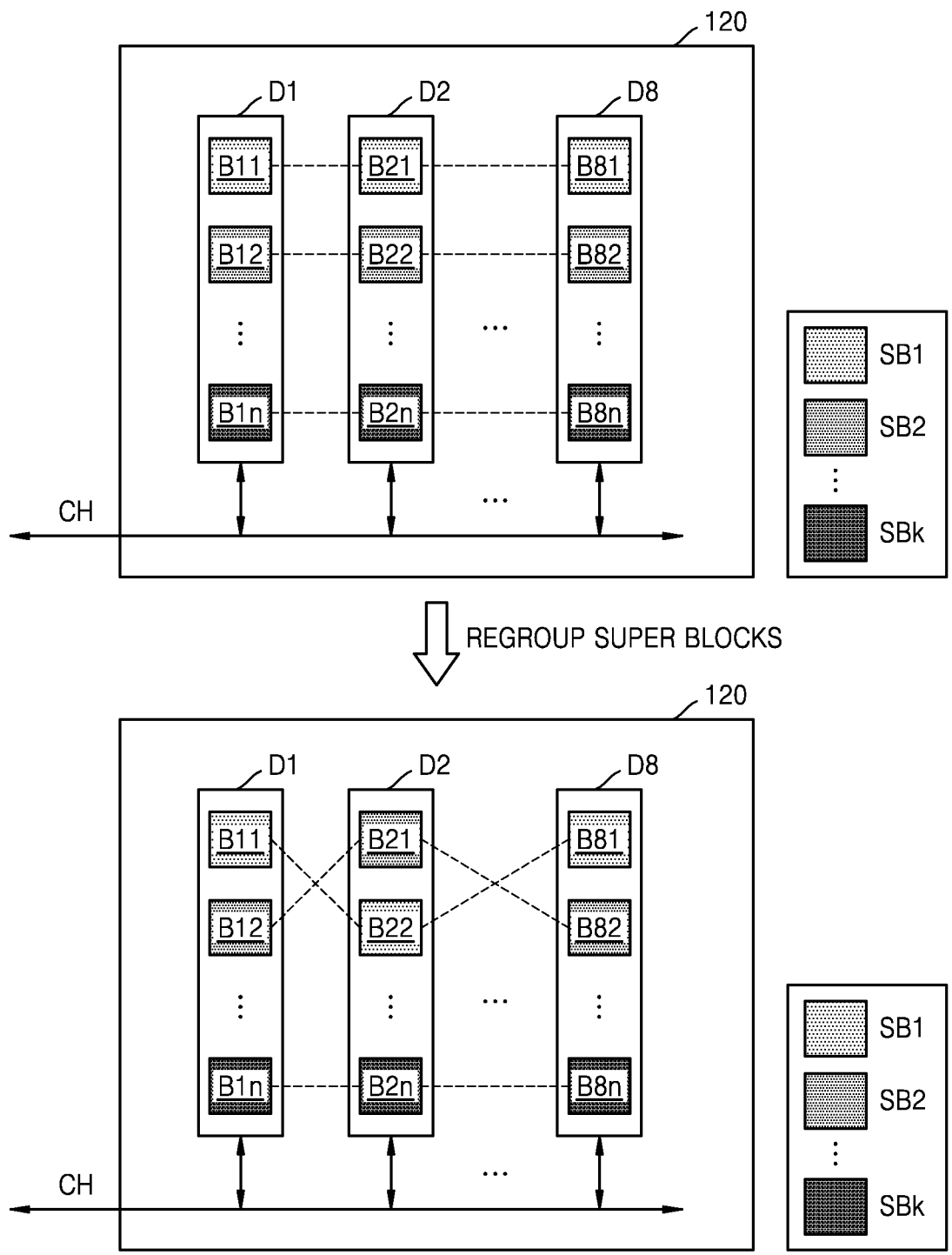

FIG. 18 is a flowchart of a method of regrouping super groups of a storage device 100, according to an exemplary embodiment of the inventive concept. FIGS. 19A and 19B illustrate examples of the regrouping method of FIG. 18.

Referring to FIG. 18, the storage device 100 performs a background read operation on each of a plurality of blocks of an NVM 120 (S610). The storage device 100 calculates a characteristic value of each of the plurality of blocks based on a result of the background read operation (S620). For example, the characteristic value may include a width of a threshold voltage distribution and a minimum level of a threshold voltage.

The storage device 100 regroups the plurality of blocks based on the characteristic value (S630).

In an embodiment, as shown in FIG. 19A, the storage device 100 regroups the plurality of blocks such that blocks having equal or similar characteristic values are included in the same super block. In FIG. 19A, before the regrouping process, blocks located at the same position or row in a plurality of devices D1 to D8 are grouped into one super block. The storage device 100 may perform the regrouping process based on the characteristic values of the plurality of blocks, which are detected due to the background read operation, and regroup blocks having equal or similar characteristic values into one super block regardless of a position of each of the blocks.

In an exemplary embodiment, the storage device 100 determines a defective block based on the characteristic value and replace the defective block by another block in a super block. For instance, referring to FIG. 19B, blocks B12 to B82 are initially grouped into a second super block SB2. When it is determined that a defect has occurred in the block B82 due to the background read operation, the block B82 is replaced by a block Bd8. Thus, the blocks B12, B22, and Bd8 may be subsequently regrouped into the second super block SB2.

Referring back to FIG. 18, the storage device 100 manages metadata and a history buffer in units of regrouped super blocks (S640).

Figure 20:
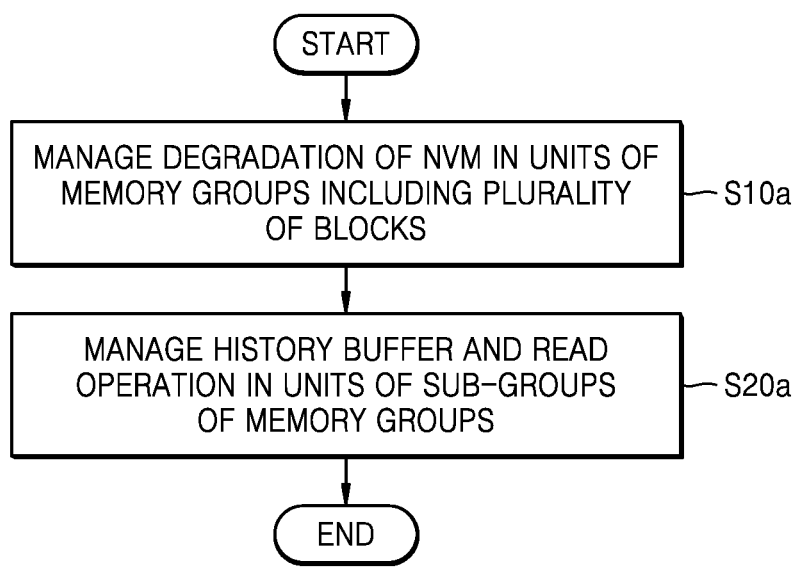
FIG. 20 is a flowchart of a method of operating a storage device, according to an exemplary embodiment of the inventive concept.
Figure 21:
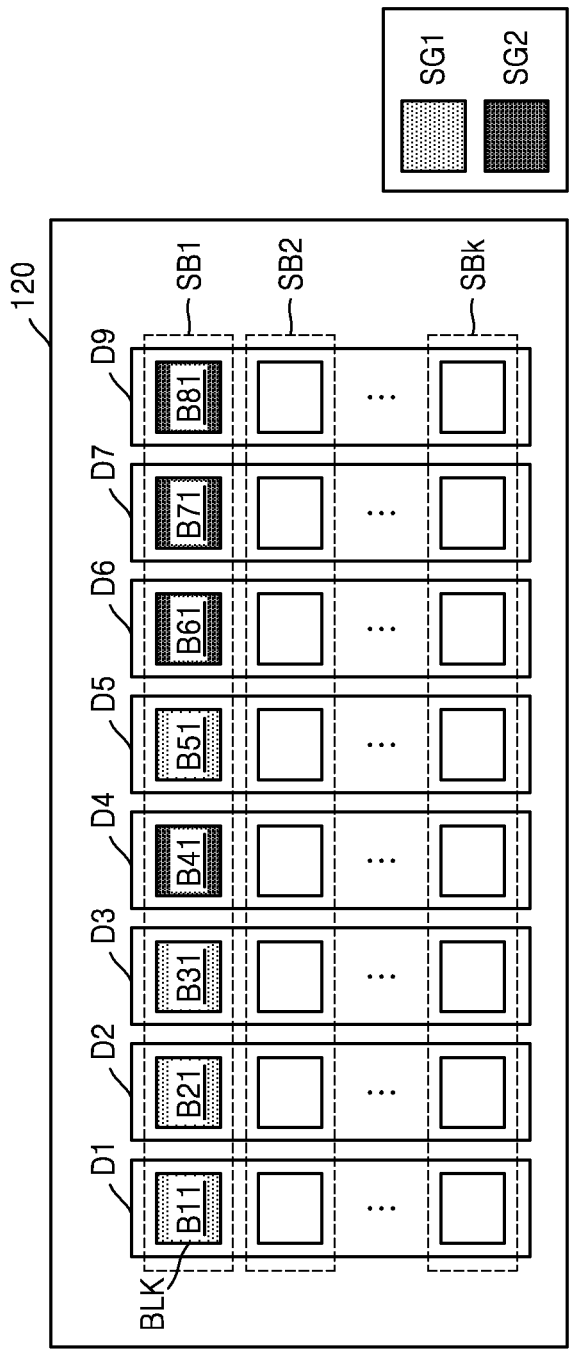
FIG. 21 illustrates an example of the operating method shown in FIG. 20.

FIG. 20 is a flowchart of a method of operating a storage device 100, according to an exemplary embodiment of the inventive concept. FIG. 21 illustrates an example of the operating method of FIG. 20.

Referring to FIG. 20, the storage device 100 manages the degradation of an NVM in units of memory groups including a plurality of blocks (S10a). The storage device 100 manages a history buffer and a read operation in units of sub-groups of the memory groups (S20a).

Referring to FIG. 21, a plurality of memory devices (e.g., the devices D1 to D8) may constitute an NVM 120, and at least one block of the devices D1 to D8 may be grouped into a super block. For example, respective first blocks (e.g., blocks B11 to B81) of the devices D1 to D8 may be grouped into a first super block SB1. Moreover, blocks having similar characteristics in a super block (e.g., the first super block SB1) may be grouped into a sub-group. For example, in the first super block SB1, blocks B11, B21, B31, and B51 may be included in a first sub-group SG1, and blocks B41, B61, B71, and B81, which have similar electrical characteristics, may be included in a second sub-group SG2.

The storage device 100 may obtain and store program and erase counts of each of a plurality of super blocks (e.g., first to k-th super blocks SB1 to SBk), manage the degradation of the NVM 120 in units of super blocks, and store and update a history read level for each of sub-groups (e.g., the first sub-group SG1 and the second sub-group SG2). Thus, the history buffer and the read operation may be managed in the units of sub-groups.

Figure 22:
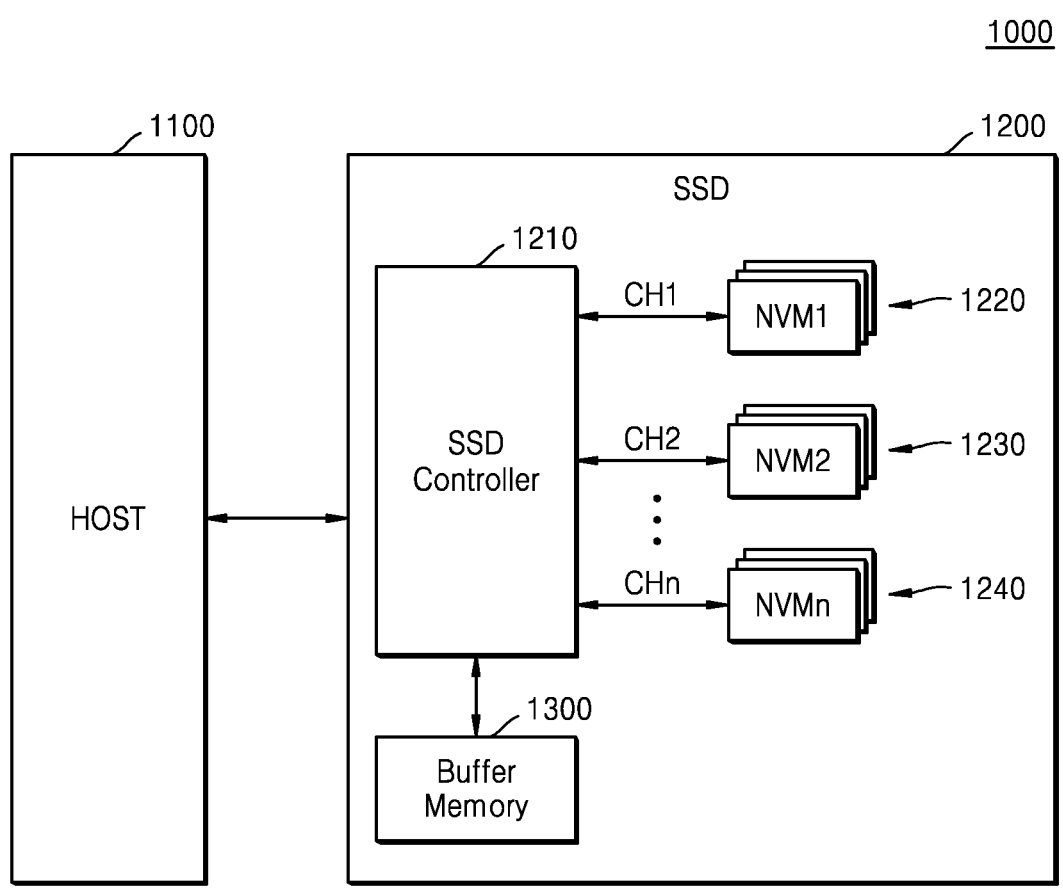
FIG. 22 is a block diagram of a solid-state drive (SSD) according to an exemplary embodiment and an SSD system including the SSD.

FIG. 22 is a block diagram of an SSD 1200 according to an exemplary embodiment of the inventive concept and an SSD system 1000 including the SSD 1200.

Referring to FIG. 22, the SSD system 1000 includes a host 1100 and the SSD 1200. The SSD 1200 may communicate with the host 1100 and transmit and receive signals (e.g., commands, addresses, and data) to and from the host 1100. The SSD 1200 may receive power from the host 2100 to operate.

The SSD 1200 includes an SSD controller 1210 (e.g., a control circuit), a plurality of NVM devices (e.g., 1220, 1230, and 1240), and a buffer memory 1300. The storage device 100 and the controller 110, which have been described with reference to FIGS. 1 to 21, may be applied to the SSD 1200 and the SSD controller 1210, respectively. For example, the SSD controller 1210 may include controller 110, controller 110a, etc. The NVM devices 1220, 1230, and 1240 may be implemented as a plurality of semiconductor chips. The SSD controller 1210 may communicate with the NVM devices 1220, 1230, and 1240 through a plurality of channels CH1, CH2, and CHn. For example, at least one memory block included in each memory chip included in each of the NVM devices 1220, 1230, and 1240 may constitute a super block. The SSD 1200 may manage metadata (e.g., a degradation degree and program and erase counts) and a history buffer (e.g., a history read level) in units of super blocks.

The buffer memory 1300 may be implemented as a volatile memory or a resistive memory. For example, the buffer memory 1300 may include a DRAM. The buffer memory 1300 may temporarily store data, which is received from the host 1100 and will be stored in the NVM devices 1220, 1230, and 1240, or data, which is read from the NVM devices 1220, 1230, and 1240 and will be transmitted to the host 1100. In an exemplary embodiment, the history buffer is implemented as a portion of the buffer memory 1300. In an exemplary embodiment, the history buffer is implemented as a portion of the buffer memory 1300.

A storage system according to at least one of the above-described embodiments may be mounted on or applied to a memory card system, a universal flash storage (UFS), and/or an embedded storage in addition to the SSD system 1000.

While the inventive concept has been particularly shown and described with reference to embodiments thereof, it will be understood that various changes in form and details may be made therein without departing from the spirit and scope of the disclosure.

What is claimed is:

1. A storage device comprising:
a non-volatile memory including a plurality of physical blocks;
a controller configured to group the plurality of physical blocks into a plurality of super blocks including a first super block that includes a first physical block and a second physical block at a first time period, and configured to perform a read operation on the first physical block based on a first read level; and
a first buffer configured to store a read level based on the first read level of the first physical block when the read operation on the first physical block based on the first read level is successfully performed and otherwise store the read level based on a second other read level,
wherein when the controller detects that the second physical block is defective based on a result of performing the read operation on the second physical block using the stored read level, the controller replaces the second physical block with a third physical block that is not included in any of the plurality of super blocks, and the third physical block has equal or similar electrical characteristics as physical blocks included in the first super block,
wherein the second read level is offset from the first read level based on a difference in electrical characteristics between the first physical block and the second physical block.

2. The storage device of claim 1, further comprising a second buffer configured to store metadata including a program and erase (P/E) cycle, program and erase counts and degradation degree information.

3. The storage device of claim 1, wherein the controller groups the plurality of physical blocks into the plurality of super blocks, based on positions of the plurality of physical blocks or based on electrical characteristics of the plurality of physical blocks.

4. The storage device of claim 1, wherein threshold-voltage distribution characteristics of the third physical block are equal or similar to threshold-voltage distribution characteristics of the physical blocks included in the first super block.

5. The storage device of claim 1, wherein the controller regroups the plurality of physical blocks into a plurality of second super blocks based on a result of the read operation on the plurality of physical blocks.

6. A storage device comprising:
a non-volatile memory including a plurality of physical blocks; and
a controller configured to group the plurality of physical blocks into a plurality of super blocks that include a first super block, the first super block including a first physical block and a second physical block at a first time period, configured to perform a read operation on the first physical block using a first read level, perform the read operation on the second physical block using a second read level offset from the first read level based on a difference in electrical characteristics between the first physical block and the second physical block, configured to detect a defective physical block in the first super block based on a result of the read operation, and configured to replace the defective physical block with a third physical block.

7. The storage device of claim 6, wherein when the controller replaces the defective physical block with the third physical block, the third physical block is not included in any of the plurality of super blocks.

8. The storage device of claim 6, wherein the controller detects the defective physical block in the first super block based on a characteristic value.

9. The storage device of claim 8, wherein the characteristic value is a width of a threshold voltage distribution.

10. The storage device of claim 8, wherein the characteristic value is a minimum level of a threshold voltage.

11. The storage device of claim 6, wherein the controller performs the read operation on the first physical block based on a first read level, and stores the first read level in a buffer, the controller calculates a second read level by adding a difference between the first physical block and the second physical block to the first read level, and the controller performs the read operation on the second physical block based on the second read level.

12. A storage device comprising:
a non-volatile memory including a plurality of physical blocks that include a first physical block and a second physical block; and
a controller configured to group the plurality of physical blocks into a plurality of first super blocks such that each of the plurality of first super blocks includes physical blocks that have equal or similar electrical characteristics at a first time period,
wherein the controller is further configured to perform a read operation on each of the plurality of physical blocks using a read level offset based on a difference in electrical characteristics between the physical blocks, and
wherein the controller is further configured to regroup the plurality of physical blocks into a plurality of second super blocks based on a result of the read operation such that each of the plurality of second super blocks includes physical blocks that have equal or similar electrical characteristics at a second time period.

13. The storage device of claim 12, wherein the controller calculates a characteristic value of each of the plurality of second super blocks based on the result of the read operation.

14. The storage device of claim 13, wherein the characteristic value is a width of a threshold voltage distribution.

15. The storage device of claim 13, wherein the characteristic value is a minimum level of a threshold voltage.

16. The storage device of claim 12, further comprising:
a first buffer configured to store program and erase counts for a third super block among the plurality of first super blocks; and
a second buffer configured to store a read level of the first physical block after the read operation on the first physical block based on the read level is successfully performed.

17. The storage device of claim 12, wherein when the controller detects that the first physical block included in one of the plurality of second super blocks is defective, the controller replaces the first physical block with a third physical block that is not included in any super block, and the third physical block has equal or similar electrical characteristics as physical blocks included in a corresponding one of the plurality of second super blocks.

18. The storage device of claim 12, wherein the controller performs the read operation based on a first read level, and stores the first read level in a buffer, the controller calculates a second read level by adding a difference between the first physical block and the second physical block to the first read level, and the controller performs the read operation on the second physical block based on the second read level.

19. The storage device of claim 12, wherein when the read operation on the first physical block among the plurality of physical blocks fails based on a first read level, the controller revises the first read level to a second read level, and performs a read retry operation on the first physical block based on the second read level.

\* \* \* \* \*